United States Patent
Kamijima et al.

(10) Patent No.: US 7,527,917 B2
(45) Date of Patent: May 5, 2009

(54) EXPOSURE METHOD AND EXPOSURE APPARATUS

(75) Inventors: Akifumi Kamijima, Tokyo (JP); Hitoshi Hatate, Tokyo (JP)

(73) Assignee: TDK Corporation, Tokyo (JP)

( * ) Notice: Subject to any disclaimer, the term of this patent is extended or adjusted under 35 U.S.C. 154(b) by 629 days.

(21) Appl. No.: 11/191,059

(22) Filed: Jul. 28, 2005

(65) Prior Publication Data

US 2006/0038970 A1    Feb. 23, 2006

(30) Foreign Application Priority Data

Aug. 23, 2004    (JP) .............................. 2004-242080

(51) Int. Cl.
*G03F 7/20* (2006.01)
*G03F 7/26* (2006.01)

(52) U.S. Cl. ....................... 430/311; 430/394; 430/396; 430/397

(58) Field of Classification Search ................. 430/311, 430/394, 396, 397
See application file for complete search history.

(56) References Cited

U.S. PATENT DOCUMENTS

| 5,981,117 | A  | 11/1999 | Magome |
| 6,118,515 | A  | 9/2000  | Wakamoto et al. |
| 6,277,533 | B1 | 8/2001  | Wakamoto et al. |
| 6,319,641 | B2 | 11/2001 | Magome |
| 6,374,479 | B1 | 4/2002  | Sasaki et al. |
| 6,513,229 | B1 | 2/2003  | Sasaki et al. |
| 6,646,829 | B2 | 11/2003 | Sasaki et al. |
| 6,757,964 | B2 | 7/2004  | Sasaki et al. |

FOREIGN PATENT DOCUMENTS

| JP | A 7-161614   | 6/1995  |
| JP | A-08-306610  | 11/1996 |
| JP | A-10-125589  | 5/1998  |
| JP | A-11-251228  | 9/1999  |
| JP | A-11-316928  | 11/1999 |
| JP | A-2001-126226 | 5/2001 |
| JP | A-2002-175962 | 6/2002 |
| JP | A-2002-246291 | 8/2002 |

*Primary Examiner*—Kathleen Duda
(74) *Attorney, Agent, or Firm*—Mitchell P. Brook; Luce, Forward, Hamilton & Scripps LLP

(57) ABSTRACT

For each of pattern projection regions, a mask and a substrate are moved in synchronization with each other in an X direction while projecting a portion of a mask pattern through an optical projection system onto a portion of the pattern projection region. An exposure region is thereby shifted from one of two ends of the pattern projection region toward the other end, the two ends being opposed to each other in the X direction. If the pattern projection region is a peripheral projection region that has a portion located outside the edge of the substrate, of the two ends of the region opposed to each other in the X direction, the exposure region is shifted from the one end that is greater in length of a portion laid over the substrate toward the other end.

7 Claims, 17 Drawing Sheets

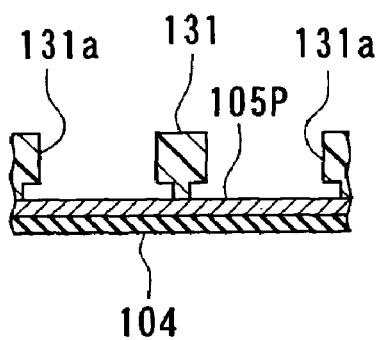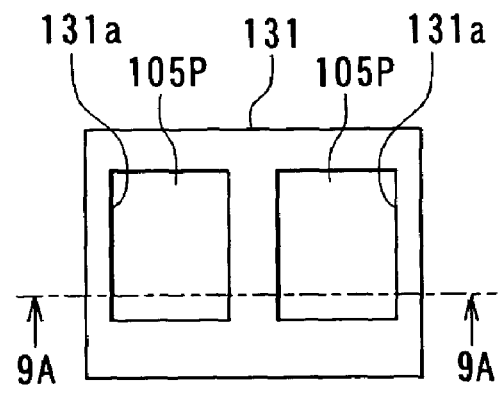
FIG. 9A  FIG. 9B
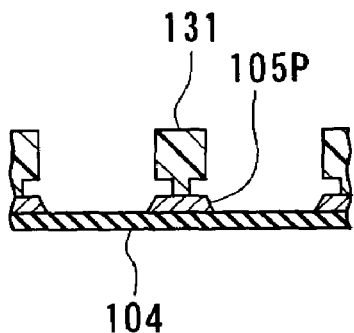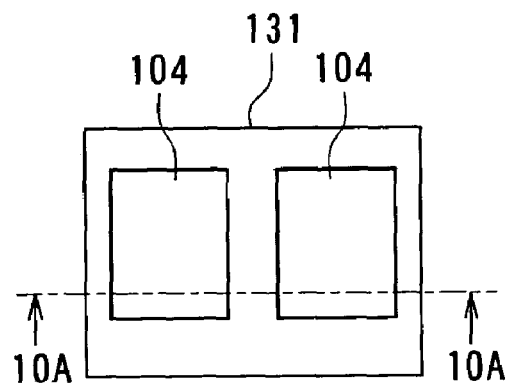
FIG. 10A  FIG. 10B

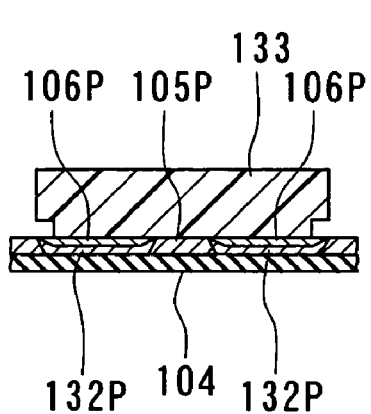
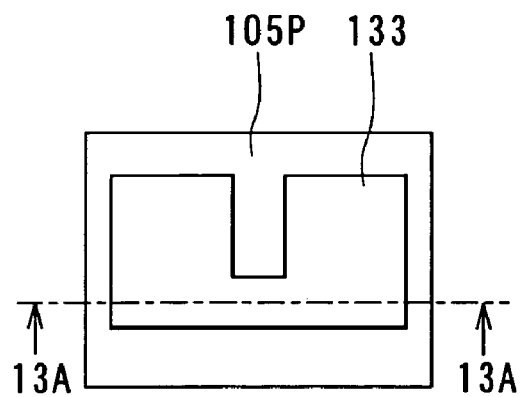
FIG. 13A    FIG. 13B
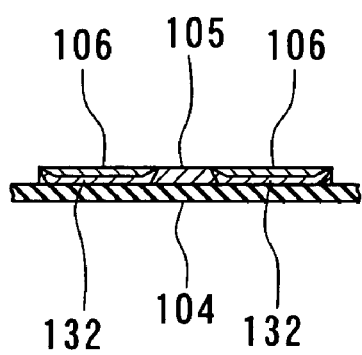
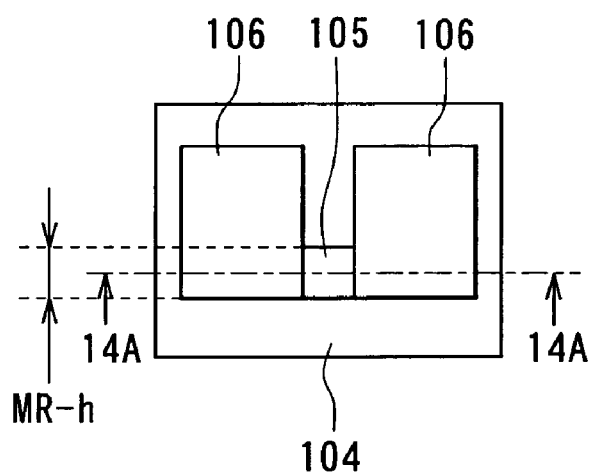
FIG. 14A    FIG. 14B

EXPOSURE METHOD AND EXPOSURE APPARATUS

BACKGROUND OF THE INVENTION

1. Field of the Invention

The present invention relates to an exposure method and an exposure apparatus that are used in manufacturing microdevices through the use of photolithography and used for exposing a substrate by projecting a pattern formed in a mask (hereinafter called a mask pattern) onto a plurality of regions in the substrate one by one by means of a scanning system.

2. Description of the Related Art

To manufacture microdevices by photolithography, a mask pattern is projected through an optical projection system onto a substrate on which a photoresist layer is formed, and the substrate is exposed by the light patterned by the mask pattern. A scanning exposure (lithography) apparatus and a step-and-scan exposure apparatus are known as exposure apparatuses used for such an exposure.

The scanning exposure apparatus is operated such that a portion of the mask pattern is projected onto the substrate through the optical projection system, and the mask and the substrate are moved in synchronization with each other, so that an exposure region in which a portion of the mask pattern is projected and exposure is performed is shifted. As a result, the entire mask pattern is projected onto the substrate, and the substrate is exposed by the light corresponding to the entire mask pattern. To shift the exposure region on the substrate for projecting the entire mask pattern onto the substrate is hereinafter called scanning. A direction in which the exposure region is shifted with respect to the substrate is hereinafter called a scanning direction. Exposure using a large-sized mask pattern is achieved through the use of the scanning exposure apparatus.

The step-and-scan exposure apparatus is operated to repeatedly perform exposure by scanning similar to that performed by the above-mentioned scanning exposure apparatus and a step-by-step movement (step) of the substrate. A region onto which the entire mask pattern is projected by a single scanning is hereinafter called a shot. According to the step-and-scan exposure apparatus, a plurality of shots are defined for a single substrate, and exposure based on the mask pattern is performed for each of the shots. Such step-and-scan exposure apparatuses are disclosed in, for example, the Published Unexamined Japanese Patent Application Heisei 11-251228 (1999), the Published Unexamined Japanese Patent Application Heisei 8-306610 (1996), the Published Unexamined Japanese Patent Application Heisei 10-125589 (1998), the Published Unexamined Japanese Patent Application 2002-246291, and the Published Unexamined Japanese Patent Application 2002-175962.

The Published Unexamined Japanese Patent Application Heisei 11-251228 discloses a technique in which the scanning directions of adjacent shots are made opposite to each other, and fine adjustment of the locations of the mask and the substrate is performed, referring to alignment compensation values that are different between the scanning directions.

The Published Unexamined Japanese Patent Application Heisei 8-306610 discloses a technique in which the scanning directions of two exposures performed for one region of the substrate are made to be the same, wherein one of the two exposures is performed through the use of a first mask pattern that proceeds, and the other of the two exposures is performed through the use of a second mask pattern that follows.

The Published Unexamined Japanese Patent Application Heisei 10-125589 discloses a technique in which, to perform exposure through the use of a specific mask pattern in a single shot, if exposure using another mask pattern has been previously done in the shot, alignment between the mask and the substrate is performed using data of the scanning direction employed at the previous exposure using the other mask pattern.

The Published Unexamined Japanese Patent Application 2002-246291 discloses a technique in which, to transfer a specific pattern to a substrate, exposure in a single shot is performed for each of a plurality of pattern divisions obtained by dividing the specific pattern, and a plurality of shots of the pattern divisions are united to transfer the specific pattern, while the directions of scanning for exposure for the respective pattern divisions are made to coincide with one another.

As disclosed in the Published Unexamined Japanese Patent Application 2002-175962, the step-and-scan exposure apparatus incorporates: a detection means for detecting the location of the surface of the substrate along the direction of optical axis of the optical projection system; and a means for adjusting the location of the substrate along the direction of optical axis of the optical projection system, based on the result of detection by the detection means, so that the image of the mask pattern is focused on the surface of the substrate. The step-and-scan exposure apparatus performs such adjustment before exposure in each shot.

The Published Unexamined Japanese Patent Application 2002-175962 discloses a technique that utilizes a multipoint focus position detection system capable of detecting a plurality of measurement points on the substrate as the above-mentioned detection means. This technique enables selection among the measurement points.

One of microdevices manufactured by photolithography is a thin-film magnetic head slider used in a magnetic disk drive. The slider has: a medium facing surface that faces toward a recording medium; and a thin-film magnetic head element disposed near the medium facing surface. A widely used type of thin-film magnetic head element is a composite thin-film magnetic head element that has a layered structure in which an induction-type electromagnetic transducer for writing and a magnetoresistive (MR) element for reading are stacked.

Typically, the thin-film magnetic head slider is manufactured through a method that will now be described. First, a number of thin-film magnetic head elements aligned in a plurality of rows are formed on a single substrate. In the process of forming the head elements, photolithography is employed to pattern various layers making up the head elements. Next, the substrate including the head elements are cut so as to form a substructure to be processed (hereinafter called a bar) in which portions to be sliders (hereinafter called slider portions) each including one of the head elements are aligned in a row, or to form a substructure to be processed (hereinafter called a block) in which slider portions are aligned in a plurality of rows. Next, if bars are formed by cutting the substrate, processing such as lapping is performed for each of the bars on all the slider portions the bar includes so as to form the medium facing surfaces of all the slider portions the bar includes. Next, the bar is cut and divided into the sliders. If blocks are formed by cutting the substrate, processing such as lapping is performed for each of the blocks on a row of the slider portions located at an end of the block so as to form the medium facing surfaces of the slider portions of the row located at the end of the block. Next, a bar made up of the row of slider portions is separated from the block, and the bar is further cut and divided into the sliders.

According to the above-described method of manufacturing the thin-film magnetic head slider, the medium facing surfaces are formed for a plurality of slider portions aligned in a row in the state of bar or block. In this step of forming the medium facing surfaces, it is required that the MR heights of the thin-film magnetic head elements aligned in the row all fall within a permissible range. The MR height is the length (height) from an end of the MR element closer to the medium facing surface to the opposite end. The step of forming the medium facing surfaces includes the step of lapping the medium facing surfaces. The MR heights are adjusted by the amount of lapping the medium facing surfaces. Such a method of manufacturing the thin-film magnetic head slider is disclosed in each of the Published Unexamined Japanese Patent Application Heisei 11-316928 (1999) and the Published Unexamined Japanese Patent Application 2001-126226, for example.

Reference is now made to FIG. 24 to describe two problems that arise when the thin-film magnetic head sliders are manufactured as described above, wherein a step-and-scan exposure apparatus is employed in the step of forming a number of thin-film magnetic head elements on a single substrate. FIG. 24 illustrates an example of positional relationship between a circular-plate-shaped substrate 201 and shots 202. In FIG. 24, the shots 202 are expressed as forty-four rectangular regions that are identical in size wherein at least one of the sides thereof is indicated with a broken line. In FIG. 24, each of ten rectangular regions 203 surrounded by solid lines indicates a range to be a single block. A portion of the substrate 201 located in each of the regions 203 is to be a single block. Each of the regions 203 includes a row of four shots 202. In FIG. 24, the regions 203 are indicated with hatching for convenience. A mask pattern to be projected onto each of the shots 202 includes a pattern corresponding to a plurality of thin-film magnetic head elements. Therefore, a plurality of slider portions are formed in a portion of the substrate 201 corresponding to a single shot 202.

The first problem results from the fact that some of the shots 202 have portions located outside the edge of the substrate 201. Such shots 202 are hereinafter called edge shots and indicated with 202E. If one or more shots 202 correspond to a single microdevice, portions of the substrate 201 corresponding to the edge shots 202E are not used for manufacturing the microdevice. However, when thin-film magnetic head sliders are manufactured, each of the shots 202 corresponds to a plurality of thin-film magnetic head sliders. Therefore, even the portions of the substrate 201 corresponding to the edge shots 202E could be used for manufacturing the head sliders. According to related art, however, it is difficult that the image of a mask pattern is correctly focused on the surface of the substrate 201 in the edge shots 202E. The reason will now be described. As described above, a step-and-scan exposure apparatus incorporates: a detection means for detecting the location of the surface of the substrate along the direction of optical axis of an optical projection system; and a means for adjusting the location of the substrate along the direction of optical axis of the optical projection system, based on the result of detection by the detection means, so that the image of the mask pattern is focused on the surface of the substrate. The step-and-scan exposure apparatus performs such adjustment before exposure in each of the shots 202. However, in the edge shots 202E, it is impossible to correctly detect the location of the surface of the substrate 201 since portions of the edge shots 202E are located outside the edge of the substrate 201. As a result, it is impossible for the edge shots 202E that the image of the mask pattern is correctly focused on the surface of the substrate 201. Consequently, variations in width of layers patterned based on the mask pattern are increased.

The first problem not only applies to cases of manufacturing thin-film magnetic head sliders but widely applies to cases in which a plurality of microdevices are formed in a portion of the substrate corresponding to a single shot.

The second problem results from the fact that a plurality of shots 202 (four shots 202 in the example shown in FIG. 24) correspond to a single bar or block. That is, in the method of manufacturing the thin-film magnetic head sliders, the medium facing surfaces of a plurality of slider portions aligned in a row in a bar or block are formed at the same time. Therefore, if there are great variations in location along the vertical direction of FIG. 24 among a plurality of shots 202 located in a single region 203 corresponding to a single block, there result great variations in MR height among a plurality of thin-film magnetic heads included in the slider portions whose medium facing surfaces are formed at the same time. For the step-and-scan exposure apparatus, even if the locations of a plurality of shots aligned in a row are predetermined such that the locations thereof along the direction of scanning coincide with one another, there may be variations among the locations of the shots after exposure along the direction of scanning, since the mechanical precision of the step-and-scan exposure apparatus is not perfect. Furthermore, the step-and-scan exposure apparatus is typically designed such that, to reduce the process time, the directions of scanning are opposite to each other in respective two of the shots adjacent to each other in the direction orthogonal to the directions of scanning. In this case, it is more likely that there is a great variation in the locations of the adjacent two shots along the direction of scanning after exposure, compared with the case in which the directions of scanning in the adjacent two shots are identical. As a result, when the directions of scanning are opposite to each other in the adjacent two shots, in particular, there result great variations in locations along the vertical direction of FIG. 24 among a plurality of shots 202 corresponding to a single block, and variations in MR height are thereby increased, too.

It is impossible to solve the first problem by any of the techniques disclosed in the Published Unexamined Japanese Patent Application Heisei 11-251228, the Published Unexamined Japanese Patent Application Heisei 8-306610, the Published Unexamined Japanese Patent Application Heisei 10-125589, and the Published Unexamined Japanese Patent Application 2002-246291. According to the technique disclosed in the Published Unexamined Japanese Patent Application 2002-175962, when the edge shots 202E are exposed, the location of the surface of the substrate 201 is detected by choosing measurement points only located within the region inside the edge of the substrate 201. It is thereby possible that the image of the mask pattern is correctly focused on the surface of the substrate 201. However, this technique has a problem that complicated processing is required for detecting the location of the surface of the substrate 201. Furthermore, the second problem is not taken into consideration in the Published Unexamined Japanese Patent Application Heisei 11-251228, the Published Unexamined Japanese Patent Application Heisei 8-306610, the Published Unexamined Japanese Patent Application Heisei 10-125589, the Published Unexamined Japanese Patent Application 2002-246291, and the Published Unexamined Japanese Patent Application 2002-175962.

OBJECT AND SUMMARY OF THE INVENTION

It is an object of the invention to provide an exposure method and an exposure apparatus for exposing a substrate by projecting a pattern formed in a mask onto a plurality of pattern projection regions one by one by means of a scanning system, wherein at least a portion of each of the pattern projection regions is laid over a portion of the substrate, the exposure method and apparatus being capable of reducing variations in width of layers patterned based on the above-mentioned pattern, even if some of the pattern projection regions have portions located outside the edge of the substrate.

An exposure method or an exposure apparatus of the invention is provided for exposing a substrate based on a pattern by sequentially projecting the pattern formed in a mask onto a plurality of pattern projection regions each of which has at least a portion laid over a portion of the substrate. In the invention, the substrate means one including a plate-shaped base to be a basis for making microdevices and including various layers formed on the base.

The exposure method of the invention comprises the steps of: exposing each of the pattern projection regions based on the pattern in such a manner that, for each of the pattern projection regions, the mask and the substrate are moved in synchronization with each other while projecting a portion of the pattern through an optical projection system onto a portion of the pattern projection region, and that an exposure region onto which the portion of the pattern is projected to perform exposure is thereby shifted from one of first and second ends of the pattern projection region toward the other end; and adjusting the location of the substrate along the direction of optical axis of the optical projection system before the step of exposing each of the pattern projection regions, in such a manner that, in each of the pattern projection regions, the location of a surface of the substrate along the direction of optical axis of the optical projection system is detected, and the location of the substrate is adjusted based on a result of the detection so that an image of the portion of the pattern is focused on the surface of the substrate.

In the step of exposing each of the pattern projection regions, in some of the pattern projection regions in each of which a portion thereof is located outside the edge of the substrate and in each of which the first and second ends have different lengths of portions laid over the substrate, the exposure region is shifted from one of the first and second ends that is greater in length of the portion laid over the substrate toward the other end.

The exposure apparatus of the invention comprises: a mask moving device for retaining and moving the mask; a substrate moving device for retaining and moving the substrate; an optical projection system for projecting a portion of the pattern formed in the mask onto a portion of each of the pattern projection regions; a detection device for detecting the location of the surface of the substrate; and a control device for controlling the mask moving device, the substrate moving device and the detection device.

The control device performs the processings of exposing each of the pattern projection regions based on the pattern in such a manner that, for each of the pattern projection regions, the mask and the substrate are moved in synchronization with each other by controlling the mask moving device and the substrate moving device while projecting the portion of the pattern through the optical projection system onto the portion of the pattern projection region, and that an exposure region onto which the portion of the pattern is projected to perform exposure is thereby shifted from one of first and second ends of the pattern projection region toward the other end; and adjusting the location of the substrate along a direction of optical axis of the optical projection system before the processing of exposing each of the pattern projection regions, in such a manner that, in each of the pattern projection regions, the location of the surface of the substrate along the direction of optical axis of the optical projection system is detected by using the detection device, and the location of the substrate is adjusted based on a result of the detection by controlling the substrate moving device, so that an image of the portion of the pattern is focused on the surface of the substrate.

In the processing of exposing each of the pattern projection regions, in some of the pattern projection regions in each of which a portion thereof is located outside the edge of the substrate and in each of which the first and second ends have different lengths of portions laid over the substrate, the control device shifts the exposure region from one of the first and second ends that is greater in length of the portion laid over the substrate toward the other end.

According to the exposure method or apparatus of the invention, in some of the pattern projection regions in each of which a portion thereof is located outside the edge of the substrate and in each of which the first and second ends have different lengths of portions laid over the substrate, the exposure region is shifted from one of the first and second ends that is greater in length of the portion laid over the substrate toward the other end. As a result, it is possible to precisely detect the location of the surface of the substrate along the direction of optical axis of the optical projection system even in a pattern projection region having a portion located outside the edge of the substrate.

In the exposure method or apparatus of the invention, in some of the pattern projection regions that are entirely located inside the edge of the substrate, the exposure region may be shifted such that directions of shift of the exposure region are opposite to each other between respective two of the pattern projection regions that are adjacent to each other in the direction orthogonal to the directions of shift of the exposure region.

In the exposure method or apparatus of the invention, the overall shape of the edge of the substrate may be substantially circle. In this case, in all the pattern projection regions, the exposure region may be shifted in a direction that moves away from an imaginary straight line passing through a center of the surface of the substrate and intersecting the direction of shift of the exposure region at a right angle. The shape that is substantially circle means that this is not limited to a complete circle but includes one in which an orientation flat or a notch, for example, is provided in a portion of the edge of the substrate but a major part of the edge forms a circular arc.

In the exposure method or apparatus of the invention, the pattern may be one intended for use for manufacturing a plurality of microdevices out of a portion of the substrate corresponding to a single pattern projection region. In this case, the microdevices may be thin-film magnetic head sliders.

In the exposure method or apparatus of the invention, the location of the surface of the substrate may be detected in a region of each of the pattern projection regions that first becomes the exposure region.

In the exposure method or apparatus of the invention, the pattern may be one intended for use for manufacturing a plurality of thin-film magnetic head sliders out of a portion of the substrate corresponding to a single pattern projection region, and the substrate may be one intended to be divided into a plurality of substructures to be processed in a manufacturing process of the thin-film magnetic head sliders, each of the substructures being made up of a portion of the substrate over which a plurality of pattern projection regions are laid, so that processing is performed for each of the substructures. In this case, the exposure region may be shifted in identical directions among a plurality of pattern projection regions corresponding to a single substructure.

According to the exposure method or apparatus of the invention, in some of the pattern projection regions in each of which a portion thereof is located outside the edge of the substrate and in each of which the first and second ends have different lengths of portions laid over the substrate, the exposure region is shifted from one of the first and second ends that is greater in length of the portion laid over the substrate toward the other end. As a result, according to the invention, it is possible to precisely detect the location of the surface of the substrate along the direction of optical axis of the optical projection system even in a pattern projection region having a portion located outside the edge of the substrate. It is thereby possible to precisely adjust the location of the substrate along the direction of optical axis of the optical projection system, so that the image of a portion of the pattern is focused on the surface of the substrate. Therefore, it is possible to reduce variations in width of layers patterned based on the above-mentioned pattern even if some of the pattern projection regions have portions located outside the edge of the substrate.

According to the invention, by shifting the exposure region in identical directions among a plurality of pattern projection regions corresponding to a single substructure to be processed, it is possible to reduce displacements among the pattern projection regions along the direction of shift of the exposure region. It is thereby possible to reduce variations in characteristics among a plurality of thin-film magnetic head sliders manufactured out of a single substructure.

Other and further objects, features and advantages of the invention will appear more fully from the following description.

BRIEF DESCRIPTION OF THE DRAWINGS

FIG. 9A and FIG. 9B are views for illustrating a step that follows the step shown in FIG. 8A and FIG. 8B.

FIG. 10A and FIG. 10B are views for illustrating a step that follows the step shown in FIG. 9A and FIG. 9B.

FIG. 13A and FIG. 13B are views for illustrating a step that follows the step shown in FIG. 12A and FIG. 12B.

FIG. 14A and FIG. 14B are views for illustrating a step that follows the step shown in FIG. 13A and FIG. 13B.

DETAILED DESCRIPTION OF THE PREFERRED EMBODIMENT

Figure 1:
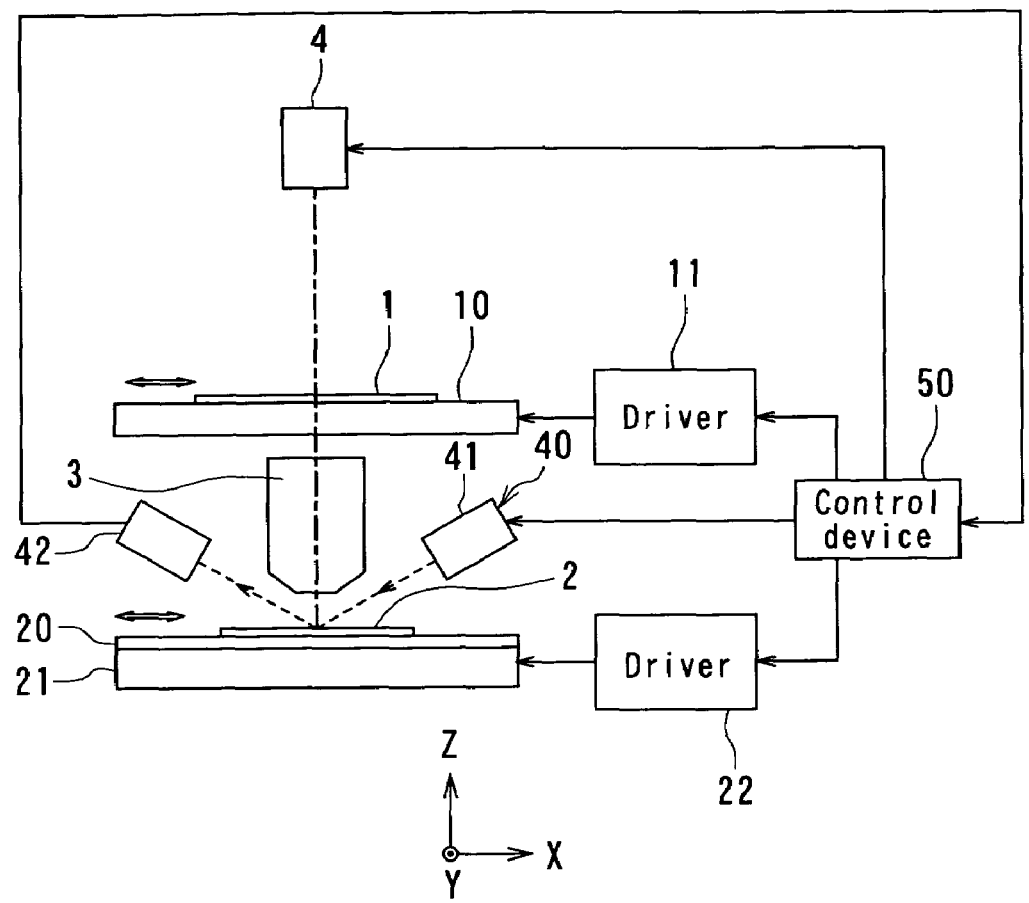
FIG. 1 is view for illustrating the main part of an exposure apparatus of an embodiment of the invention.
Figure 2:
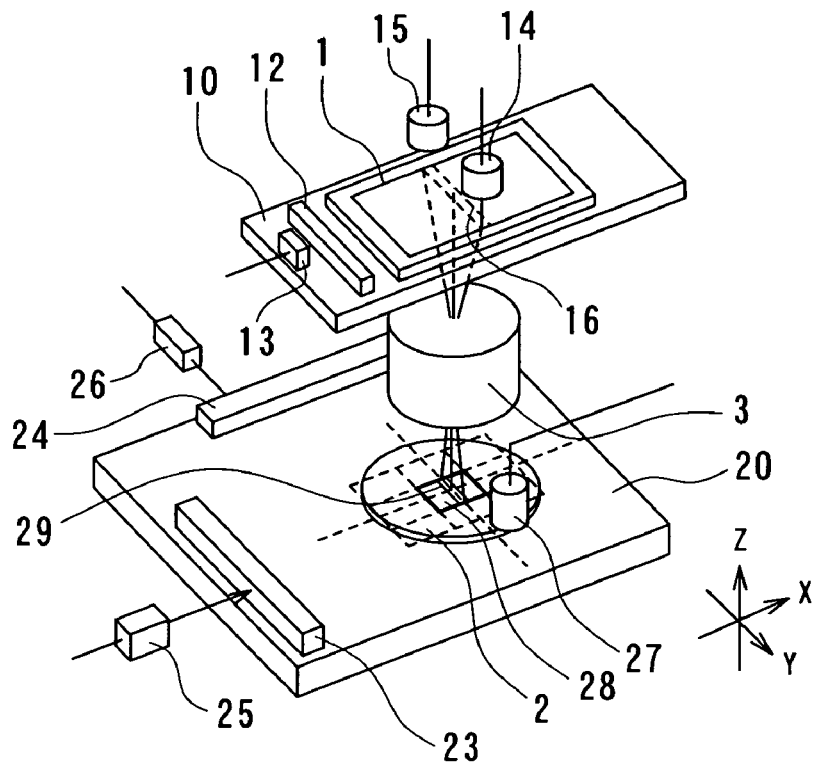
FIG. 2 is a perspective view for illustrating the main part of the exposure apparatus of the embodiment of the invention.
Figure 3:
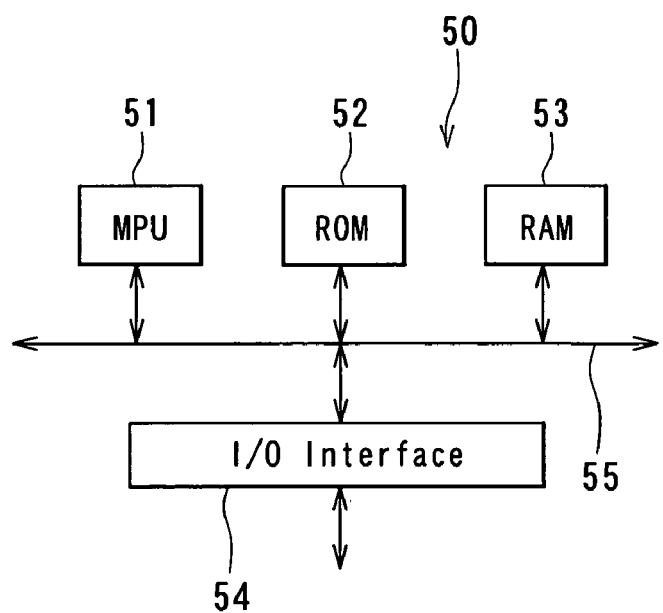
FIG. 3 is a block diagram illustrating the configuration of the control device of FIG. 1.

A preferred embodiment of the invention will now be described in detail with reference to the accompanying drawings. Reference is now made to FIG. 1 to FIG. 3 to describe the configuration of an exposure apparatus of an embodiment of the invention. FIG. 1 is a view for illustrating the main part of the exposure apparatus of the embodiment. FIG. 2 is a perspective view for illustrating the main part of the exposure apparatus. FIG. 3 is a block diagram showing the configuration of the control device of FIG. 1. The exposure apparatus of the embodiment is a step-and-scan exposure apparatus that is used in manufacturing microdevices by photolithography and used for exposing a substrate by projecting a pattern formed in a mask (hereinafter called a mask pattern) onto a plurality of regions on the substrate one by one by means of a scanning system.

As shown in FIG. 1 and FIG. 2, the exposure apparatus of the embodiment comprises: a mask stage 10 for retaining a mask 1; a substrate stage 20 for retaining a substrate 2; a moving mechanism 21 for moving the substrate stage 20; an optical projection system 3; and an illuminating device 4. The mask stage 10 is disposed above the substrate stage 20. The optical projection system 3 is disposed between the mask stage 10 and the substrate stage 20. The illuminating device 4 is disposed above the mask stage 10 and applies light for exposure to the mask 1.

The moving mechanism 21 is capable of moving the substrate stage 20 in X, Y and Z directions of FIG. 1 and FIG. 2 and capable of changing the angle of tilt of the substrate stage 20 with respect to the X-Y plane. The X and Y directions are orthogonal to each other and are both orthogonal to the direction of optical axis of the optical projection system 3. The Z direction is parallel to the direction of optical axis of the optical projection system 3. The exposure apparatus further comprises a driver 22 for driving the moving mechanism 21 for moving the substrate 2. The substrate stage 20, the moving mechanism 21 and the driver 22 correspond to the substrate moving device of the invention.

The moving mechanism 21 has a configuration as will now be described, for example. The moving mechanism 21 incorporates: a Y stage capable of moving in the Y direction; an X stage disposed on the Y stage and capable of moving in the X direction; and three or more actuators that are provided in three or more regions in the X stage, support the substrate stage 20, and have upper end portions capable of moving in the Z directions. The Y stage, the X stage and the actuators are driven by the driver 22. The moving mechanism 21 is capable of moving the substrate stage 20 in the Y direction by moving the Y stage, and in the X direction by moving the X stage. The moving mechanism 21 is also capable of moving the substrate stage 20 in the Z direction and changing the angle of tilt of the substrate stage 20 with respect to the X-Y plane, by driving the actuators.

The mask stage 10 is capable of moving in the X direction. The exposure apparatus further comprises a driver 11 for driving the mask stage 10 for moving the mask 1. The mask stage 10 and the driver 11 correspond to the mask moving device of the invention.

The exposure apparatus further comprises a detection device 40 for detecting the location of the surface of the substrate 2 and the angle of tilt of the surface of the substrate 2 with respect to the X-Y plane. The detection device 40 incorporates, for example: an irradiating section 41 for applying a plurality of ray bundles in a slanting direction to a plurality of measurement points predetermined on the surface of the substrate 2; and a detection section 42 for detecting the ray bundles emitted from the irradiating section 41 and reflected off the surface of the substrate 2.

The exposure apparatus further comprises a control device 50 for controlling the illuminating device 4, the drivers 11 and 22, and the detection device 40.

As shown in FIG. 2, a moving mirror 12 is fixed to a portion of the top surface of the mask stage 10 near an end thereof along the X direction. A moving mirror 23 is fixed to a portion of the top surface of the substrate stage 20 near an end thereof along the X direction, and a moving mirror 24 is fixed to a portion of the top surface of the substrate stage 20 near an end thereof along the Y direction. The exposure apparatus further comprises: a laser interferometer 13 that is opposed to the moving mirror 12 and detects the location of the moving mirror 12 along the X direction; a laser interferometer 25 that is opposed to the moving mirror 23 and detects the location of the moving mirror 23 along the X direction; and a laser interferometer 26 that is opposed to the moving mirror 24 and detects the location of the moving mirror 24 along the Y direction. Output signals of the laser interferometers 13, 25 and 26 are received at the control device 50. The control device 50 recognizes the location of the mask stage 10 along the X direction based on the output signal of the laser interferometer 13, and recognizes the location of the substrate stage 20 along the X and Y directions based on the output signals of the laser interferometers 25 and 26.

The exposure apparatus further comprises: two observing microscopes 14 and 15 disposed above the mask stage 10; and an observing microscope 27 provided above the substrate stage 20 in a location off the optical axis of the optical projection system 3. The observing microscopes 14 and 15 are used for observing alignment marks formed in the mask 1. The observing microscope 27 is used for observing alignment marks formed in the substrate 2. Images obtained by the observing microscopes 14, 15 and 27 are each converted to electric signals and received at the control device 50.

As shown in FIG. 3, the control device 50 comprises a microprocessor unit (MPU) 51, a read only memory (ROM) 52, a random access memory (RAM) 53, an input-output (I/O) interface 54, and a bus 55 for connecting the MPU 51, the ROM 52, the RAM 53 and the interface 54 to one another. The control device 50 is designed so that the MPU 51 executes programs stored in the ROM 52, using the RAM 53 as a work area, so as to perform various processings that will be described later. The input-output interface 54 is connected to the illuminating device 4, the drivers 11 and 22, the irradiating section 41, the detecting section 42, the laser interferometers 13, 25 and 26, and the observing microscopes 14, 15 and 27.

The outlines of the operation and exposure method of the exposure apparatus of the embodiment will now be described. In the exposure apparatus, the mask stage 10 retains the mask 1 while the substrate stage 20 retains the substrate 2. The substrate 2 includes a plate-shaped base to be a basis for making microdevices, and various layers formed on the base. When the substrate 2 is exposed by using the exposure apparatus, the uppermost layer of the substrate 2 is a photoresist layer. The overall shape of the edge of the substrate 2 is substantially circle. A pattern for patterning a specific layer of the substrate 2 by photolithography is formed in the mask 1 (This pattern is hereinafter called a mask pattern).

The illuminating device 4 applies a ray bundle for exposure to a portion of the mask 1, the ray bundle having a cross section that has the shape of rectangle that is long in the Y direction. A region of the mask 1 irradiated with the above-mentioned ray bundle is hereinafter called an irradiation region 16. The ray bundle passing through the irradiation region 16 is applied to a portion of the surface of the substrate 2 by the optical projection system. As a result, a portion of the mask pattern located in the irradiation region 16 is projected onto the portion of the surface of the substrate 2 through the optical projection system 3.

In the embodiment, as shown in FIG. 2, a plurality of pattern projection regions 28 each of which has at least a portion laid over a portion of the substrate 2 are defined in a specific range including the substrate 2 and a region around the substrate 2. For each of the pattern projection regions 28, the exposure apparatus moves the mask 1 and the substrate 2 in synchronization with each other in the X direction while projecting a portion of the mask pattern through the optical projection system 3 onto a portion of the pattern projection region 28. In each of the pattern projection regions 28, a region in which a portion of the mask pattern is projected and exposure is performed is hereinafter called an exposure region 29. Through the above-described operation, the exposure apparatus shifts the exposure region 29 from one of two ends of each of the pattern projection regions 28, the two ends being opposed each other in the X direction, toward the other of the ends. As a result, the entire pattern projection region 28 is exposed based on the entire mask pattern. The two ends of each of the pattern projection regions 28 opposed to each other in the X direction correspond to the first and second ends of the invention.

The mask 1 is moved by driving the mask stage 10 by the driver 11, based on the control performed by the control device 50. The substrate 2 is moved by driving the moving mechanism 21 by the driver 22, based on the control performed by the control device 50. The control device 50 recognizes the location of the mask stage 10 along the X direction, based on the output signal of the laser interferometer 13.

The control device 50 recognizes the locations of the alignment marks formed in the mask 1, based on the output signals of the observing microscopes 14 and 15. In addition, the control device 50 recognizes the location of the substrate stage 20 along the X and Y directions, based on the output signals of the laser interferometer 25 and 26, and thereby further recognizes the location of the substrate 2 along the X and Y directions. The control device 50 recognizes the locations of the alignment marks formed in the substrate 2, based on the output signal of the observing microscope 27.

After performing the processing of exposing one of the pattern projection regions 28 based on the mask pattern, the exposure apparatus moves the substrate 2 in the X or Y direction, and performs the processing of exposing in the same way in the next one of the pattern projection regions 28.

Before the processing of exposing each of the pattern projection regions 28, the exposure apparatus detects the location of the surface of the substrate 2 along the direction of optical axis of the optical projection system 3 (the Z direction), and detects the angle of tilt of the surface of the substrate 2 with respect to the X-Y plane, using the detection device 40, in each of the pattern projection regions 28. Here, some of the measurement points predetermined on the surface of the substrate 2 by the detection device 40 are located in a region to be the exposure region 29 (hereinafter referred to as the center measurement region). The remainder of the measurement points are located in regions (hereinafter referred to as the neighboring measurement regions) near both sides of the center measurement region, the sides being opposed to each other in the X direction.

The center measurement region is laid over the region first to be the exposure region immediately before exposure of the respective pattern projection regions 28 is started. Before exposure of the respective pattern projection regions 28, the control device 50 detects the location and angle of tilt of the surface of the substrate 2 in the region first to be the exposure region, based on the results of detection obtained at the measurement points in the center measurement region. The location and angle of tilt of the surface of the substrate 2 may be detected by, for example, detecting the locations of a plurality of measurement points along the Z direction and then approximately obtaining the surface of the substrate 2 by the least square method using the locations thus detected. Based on the results of detection, the control device 50 controls the driver 22 to adjust the location of the substrate 2 along the direction of optical axis of the optical projection system 3 (the Z direction) and to adjust the angle of tilt of the substrate 2, so that the surface of the substrate 2 is brought to an ideal state, that is, so that the image of a portion of the mask pattern is focused on the surface of the substrate 2 and that the surface of the substrate 2 is parallel to the X-Y plane.

After exposure of the respective pattern projection regions 28 is started, the center measurement region shifts together with the exposure region 29 in each of the pattern projection regions 28. At this time, the neighboring measurement regions are located near the front and the rear of the exposure region 29 along the direction of shift of the exposure region. While each of the pattern projection regions 28 is exposed, the control device 50 estimates the location of the surface of the substrate 2 forward of the direction of shift of the exposure region 29 and the angle of tilt thereof, based on the results of detection at the measurement points in the center measurement region and the results of detection at some of the measurement points in the neighboring measurement regions that are located forward of the direction of shift of the exposure region 29. The control device 50 then adjusts the location and the angle of tilt of the substrate 2, based on the result of estimation, so that the state of the surface of the substrate 2 is closer to an ideal one.

The mask pattern includes alignment marks. Therefore, alignment marks are formed in a layer of the substrate 2 that is patterned based on the mask pattern. When the substrate 2 is exposed based on the mask pattern, if any layer including the alignment marks has not been formed before the exposure, the control device 50 assumes X, Y coordinates on the substrate 2, referring to the center point of the substrate 2 obtained from the outer dimensions of the substrate 2, and determines the locations of a plurality of pattern projection regions 28 based on the X, Y coordinates.

When the substrate 2 is exposed based on the mask pattern, if a layer including the alignment marks has been formed before the exposure, the control device 50 detects some of the alignment marks located at predetermined points among all the alignment marks of the layer formed before the exposure, by using the observing microscope 27. The control device 50 then assumes X, Y coordinates on the layer formed before the exposure, based on the locations of a plurality of alignment marks detected, and makes X, Y coordinates serving as a reference for a plurality of pattern projection regions 28 to be exposed coincide with the X, Y coordinates assumed on the layer formed before the exposure. The locations of the pattern projection regions 28 are thereby determined.

Since the mechanical precision of the exposure apparatus is not perfect, there are some cases in which the locations of the pattern projection regions 28 after exposure is actually performed are off the locations of the pattern projection regions 28 determined by the control device 50 before exposure as described above.

Figure 4:
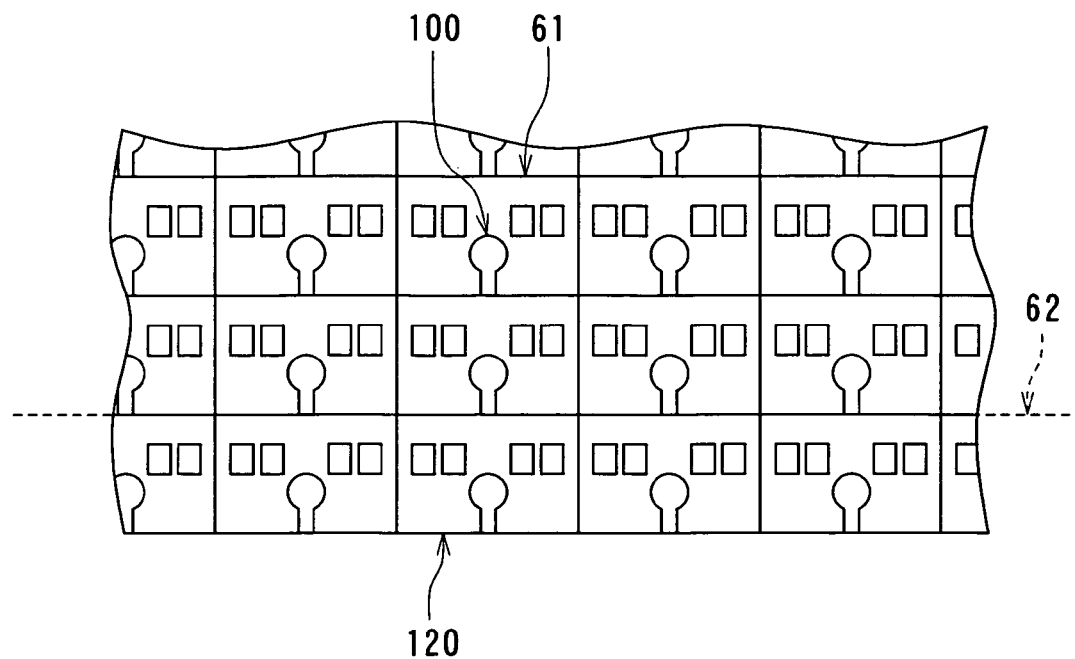
FIG. 4 is a view for illustrating a method of manufacturing thin-film magnetic head sliders.

A thin-film magnetic head slider (that will be simply called a slider) will now be described, which is an example of microdevices manufactured through the exposure apparatus and the exposure method of the embodiment of the invention. Reference is now made to FIG. 4 to describe a method of manufacturing the slider. The slider incorporates: a medium facing surface that faces toward a recording medium; and a thin-film magnetic head element disposed near the medium facing surface, which will be described in detail later. The thin-film magnetic head element has a structure in which, for example, an induction-type electromagnetic transducer for writing and an MR element for reading are stacked.

The slider is manufactured through a method that will now be described. First, a number of thin-film magnetic head elements aligned in a plurality of rows in the identical orientations are formed on a single substrate 2. In the process of forming the head elements, photolithography is employed to pattern various layers making up the head elements, and the exposure apparatus and method of the embodiment are used. When the head elements are formed, the substrate 2 includes a plurality of rows of slider portions. Each of the slider portions includes one of the head elements.

Next, the substrate 2 is cut so as to form a bar that is a substructure to be processed in which the slider portions are aligned in a row, or to form a block that is a substructure to be processed in which the slider portions are aligned in a plurality of rows. Next, if bars are formed by cutting the substrate 2, processing such as lapping is performed for each of the bars on all the slider portions the bar includes so as to form the medium facing surfaces of all the slider portions the bar includes. Next, the bar is cut and divided into the sliders. If blocks are formed by cutting the substrate 2, processing such as lapping is performed for each of the blocks on a row of the slider portions located at an end of the block so as to form the medium facing surfaces of the slider portions of the row located at the end of the block. Next, a bar made up of the row of slider portions is separated from the block, and the bar is further cut and divided into the sliders.

A case in which a block is formed by cutting the substrate 2 will now be described as an example. FIG. 4 illustrates a portion of the block. As shown in FIG. 4, the block includes a plurality of rows of slider portions 61. Each of the slider portions 61 includes one thin-film magnetic head element 100. A row of slider portions 61 is located at an end of the block. Processing such as lapping is performed on the row of slider portions 61, and the medium facing surfaces 120 of the row of slider portions 61 are thereby formed. After the medium facing surfaces 120 are formed, the block is cut at the position of a line indicated with numeral 62 of FIG. 4, so that a bar made up of the row of slider portions 61 is separated from the block. The bar is further cut so that the sliders are separated.

Figure 5:
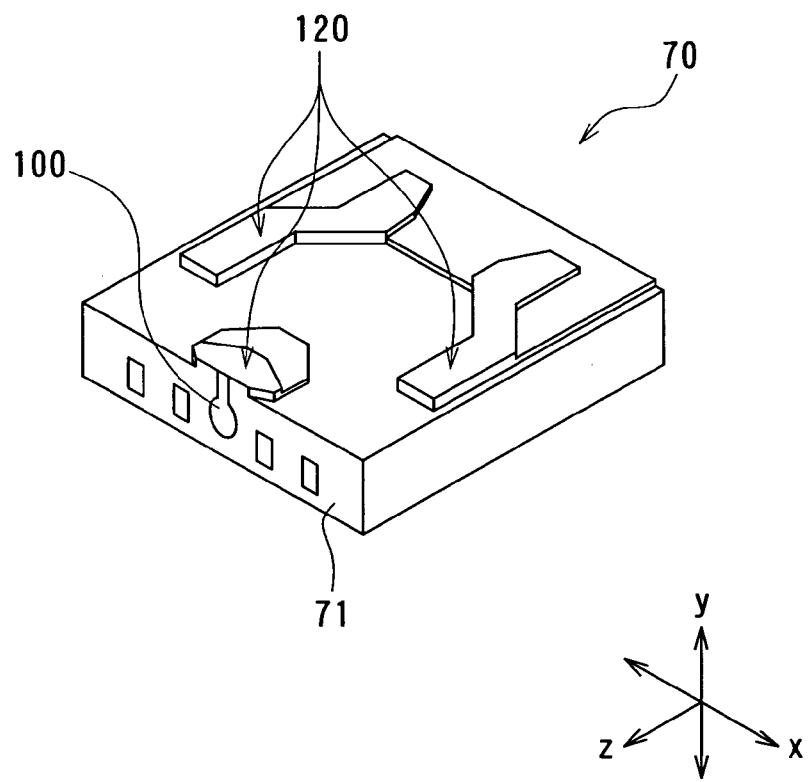
FIG. 5 is a perspective view for illustrating an example of shape of a thin-film magnetic head slider.

FIG. 5 is a perspective view illustrating an example of shape of the slider manufactured as described above. As shown in FIG. 5, in a magnetic disk drive, the slider 70 is placed to face toward a circular-plate-shaped recording medium to be rotated and driven. The slider 70 comprises a slider main body 71. The main body 71 is nearly hexahedron-shaped. One of the six surfaces of the main body 71 faces toward the recording medium. The medium facing surface 120 is formed in this one of the surfaces. When the recording medium rotates in the z direction of FIG. 5, an airflow passes between the recording medium and the slider 70 and a lift is thereby generated below the slider 70 in the y direction of FIG. 5 and exerted on the slider 70. The slider 70 flies over the recording medium by means of the lift. The x direction of FIG. 5 is across the tracks of the recording medium. The thin-film magnetic head element 100 is provided near the air-outflow-side end (the end located at the lower left of FIG. 5) of the slider main body 71 and near the medium facing surface 120.

Figure 6:
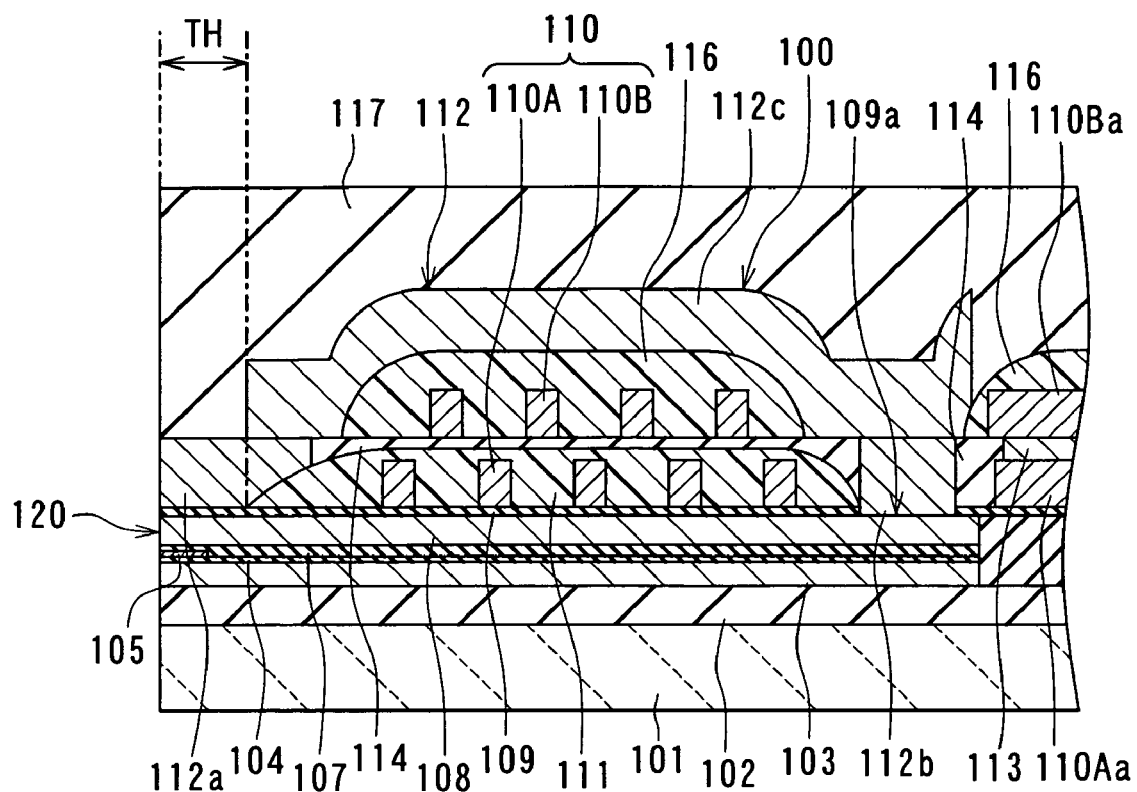
FIG. 6 is a cross-sectional view of a thin-film magnetic head element of the embodiment of the invention, wherein the cross section is orthogonal to the medium facing surface and the substrate.
Figure 7:
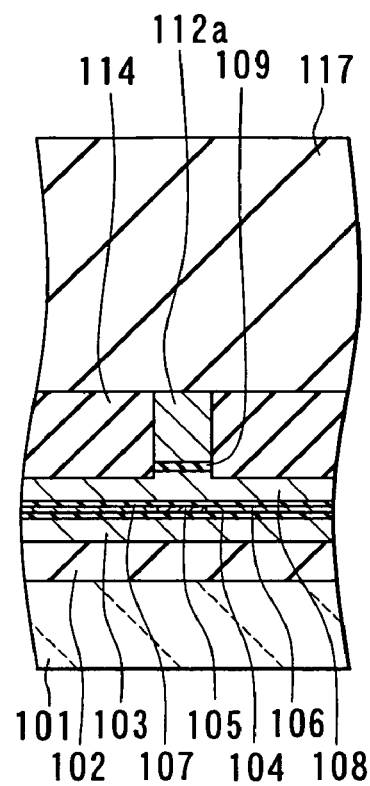
FIG. 7 is a cross-sectional view of a pole portion of the thin-film magnetic head element of the embodiment of the invention, wherein the cross section is parallel to the medium facing surface.

Reference is now made to FIG. 6 and FIG. 7 to describe the configuration and manufacturing method of the thin-film magnetic head element 100 that the slider 70 includes. FIG. 6 is a cross-sectional view of the head element 100 orthogonal to the medium facing surface and the substrate. FIG. 7 is a cross-sectional view of a pole portion of the head element 100 parallel to the medium facing surface.

In the method of manufacturing the thin-film magnetic head element 100, first, an insulating layer 102 made of an insulating material such as alumina ($Al_2O_3$) and having a thickness of 1 to 5 μm, for example, is formed by a method such as sputtering on a base 101 made of a ceramic such as aluminum oxide and titanium carbide ($Al_2O_3$—TiC). Next, a bottom shield layer 103 for a read element made of a magnetic material such as Permalloy (NiFe) and having a thickness of approximately 3 μm, for example, is formed on the insulating layer 102 by a method such as sputtering or plating.

Next, a bottom shield gap film 104 made of an insulating material and having a thickness of 10 to 200 nm, for example, is formed on the bottom shield layer 103 by a method such as sputtering. Next, an MR element 105 for reading, a pair of bias field applying layers not shown and a pair of electrode layers 106 each of which has a thickness of tens of nanometers are formed on the bottom shield gap film 104. Next, a top shield gap film 107 made of an insulating material and having a thickness of 10 to 200 nm, for example, is formed on the bottom shield gap film 104 and the MR element 105 by a method such as sputtering.

Figure 22:
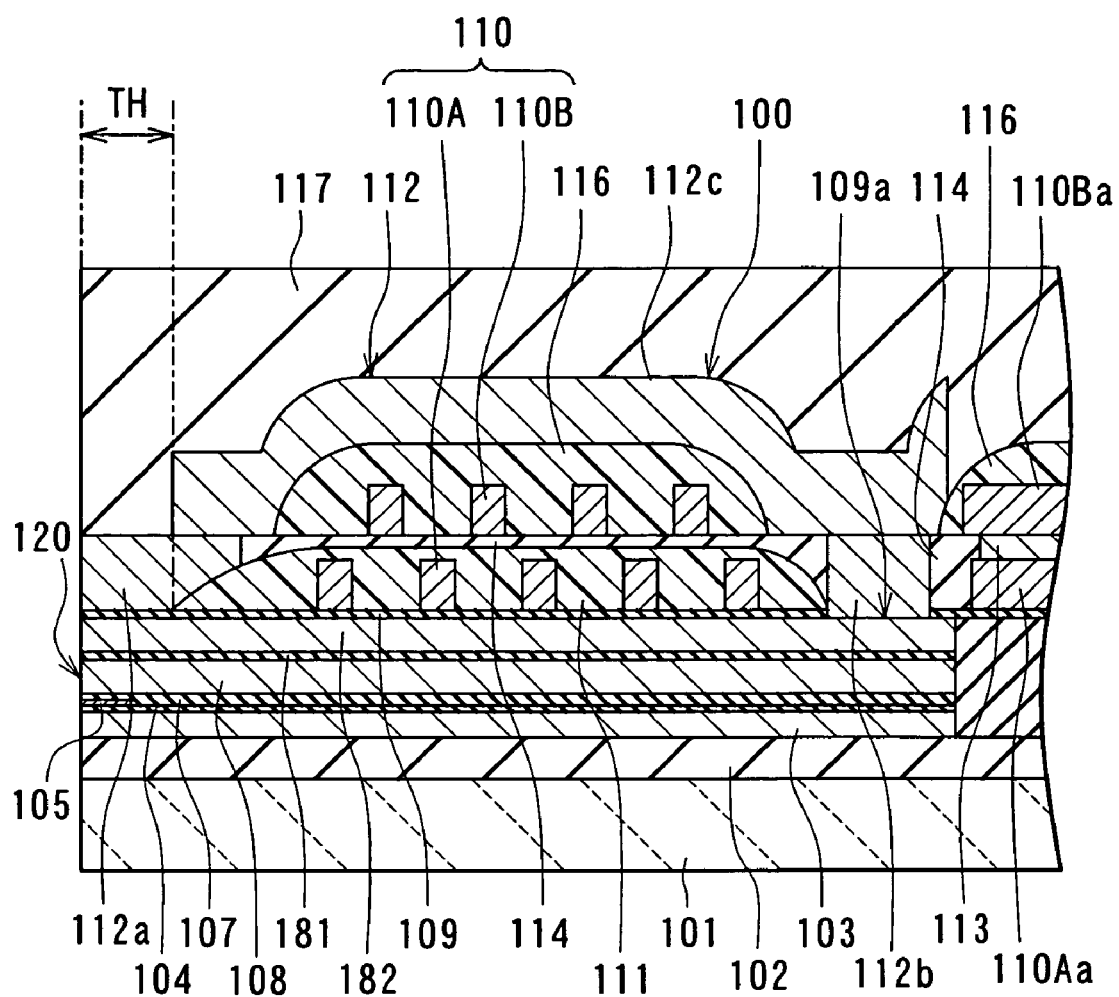
FIG. 22 is a cross-sectional view of a thin-film magnetic head element of a modification example of the embodiment of the invention, wherein the cross section is orthogonal to the medium facing surface and the substrate.
Figure 23:
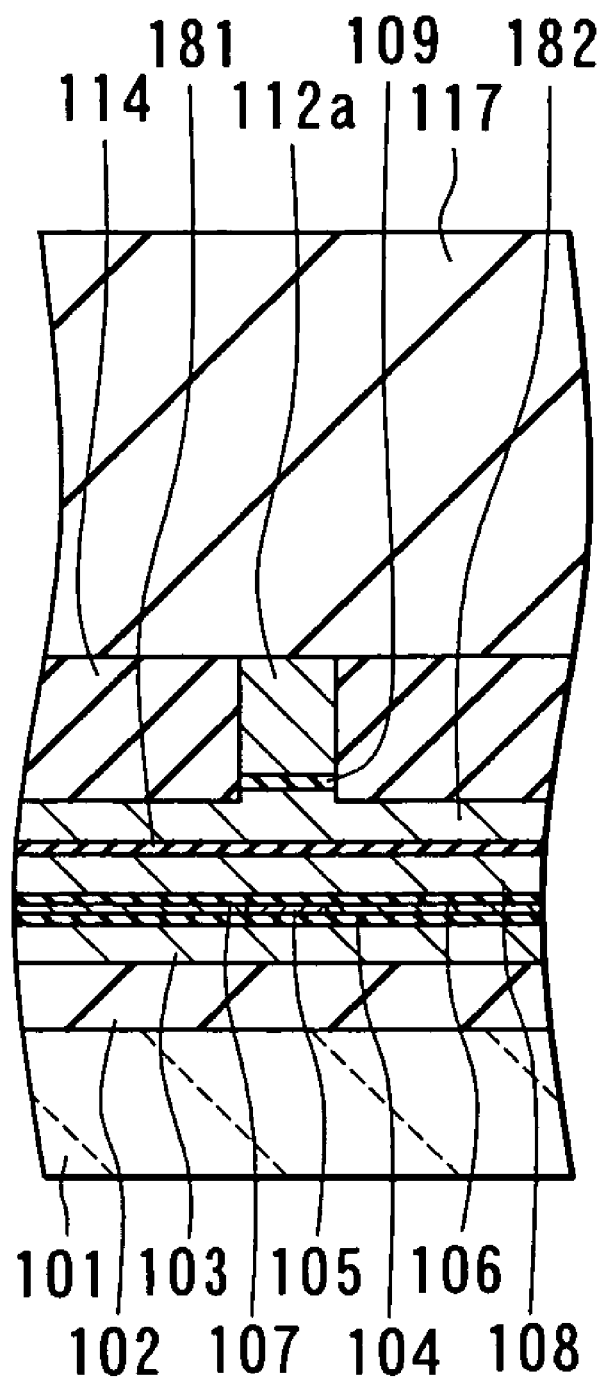
FIG. 23 is a cross-sectional view of the pole portion of the thin-film magnetic head element of the modification example of the embodiment of the invention, wherein the cross section is parallel to the medium facing surface.

Next, a top shield layer 108 for the read element is formed on the top shield gap film 107. The top shield layer 108 is made of a magnetic material and has a thickness of 3 to 4 μm, for example, and also functions as a bottom pole layer of a write element. The top shield layer 108 is made of a soft magnetic material such as NiFe, CoFe, CoFeNi or FeN. The top shield layer 108 is formed by sputtering or plating, for example. Alternatively, as shown in FIG. 22 and FIG. 23, a top shield layer 108 that does not function as the bottom pole layer, a separating layer 181 and a bottom pole layer 182 may be provided in place of the top shield layer 108 that also functions as the bottom pole layer. The separating layer 181 is made of a nonmagnetic material such as alumina and formed by sputtering, for example, on the top shield layer 108 that does not function as the bottom pole layer. The bottom pole layer 182 is formed on the separating layer 181. The separating layer 181 may be a nonmagnetic conductive layer.

Next, a write gap layer 109 made of a nonmagnetic material such as alumina and having a thickness of 50 to 300 nm, for example, is formed on the top shield layer 108 (or the bottom pole layer 182) by a method such as sputtering. Next, to make a magnetic path, a portion of the write gap layer 109 is etched to form a contact hole 109a in a center portion of a thin-film coil 110 described later.

Next, a first layer portion 110A of the thin-film coil 110 made of copper (Cu), for example, and having a thickness of 2 to 3 μm, for example, is formed on the write gap layer 109. The coil 110 has the first layer portion 110A ad a second layer portion 110B that will be described later. In FIG. 6, numeral 110Aa indicates a connecting portion of the first layer portion 110A connected to the second layer portion 110B. The first layer portion 110A is wound around the contact hole 109a.

Next, an insulating layer 111 having a specific pattern is formed to cover the first layer portion 110A and the write gap layer 109 disposed around the first layer portion 110A. The insulating layer 111 is made of an organic insulating material that exhibits fluidity when heated, such as photoresist. Next, heat treatment is performed at a specific temperature to flatten the surface of the insulating layer 111. Through this heat treatment, each of the outer and inner edge portions of the insulating layer 111 is made to have a shape of rounded sloped surface.

Next, a track width defining layer 112a of a top pole layer 112 made of a magnetic material for the write element is formed on regions of the write gap layer 109 and the insulating layer 111, the regions extending from a sloped portion of the insulating layer 111 closer to a medium facing surface 120 described later toward the medium facing surface 120. The top pole layer 112 is made up of the track width defining layer 112a, and a coupling portion layer 112b and a yoke portion layer 112c that will be described later.

The track width defining layer 112a has: a tip portion that is formed on the write gap layer 109 and functions as the pole portion of the top pole layer 112; and a connecting portion that is formed on the sloped portion of the insulating layer 111 closer to the medium facing surface 120 and connected to the yoke portion layer 112c. The tip portion has a width equal to the write track width. The connecting portion has a width greater than that of the tip portion.

When the track width defining layer 112a is formed, the coupling portion layer 112b made of a magnetic material is formed in the contact hole 109a and a connecting layer 113 made of a magnetic material is formed on the connecting portion 110Aa at the same time. The coupling portion layer 112b makes up a portion of the top pole layer 112 that is magnetically coupled to the top shield layer 108 (or the bottom pole layer 182).

Next, pole trimming is performed. That is, in a region around the track width defining layer 112a, the write gap layer 109 and at least a portion of the pole portion of the top shield layer 108 (or the bottom pole layer 182) close to the write gap layer 109 are etched, using the track width defining layer 112a as a mask. As a result, as shown in FIG. 7, a trim structure is formed, wherein the pole portion of the top pole layer 112, the write gap layer 109 and at least a portion of the pole portion of the top shield layer 108 (or the bottom pole layer 182) have equal widths. The trim structure has an effect of preventing an increase in effective track width resulting from an expansion of magnetic flux near the write gap layer 109.

Next, an insulating layer 114 made of an inorganic insulating material such as alumina and having a thickness of 3 to 4 µm, for example, is formed over the entire surface. The insulating layer 114 is then polished by chemical mechanical polishing, for example, to reach the surfaces of the track width defining layer 112a, the coupling portion layer 112b and the connecting layer 113, and flattened.

Next, the second layer portion 110B made of copper (Cu), for example, and having a thickness of 2 to 3 µm, for example, is formed on the flattened insulating layer 114. In FIG. 6, numeral 110Ba indicates a connecting portion of the second layer portion 110B connected to the connecting portion 110Aa of the first layer portion 110A through the connecting layer 113. The second layer portion 110B is wound around the coupling portion layer 112b.

Next, an insulating layer 116 having a specific pattern is formed to cover the second layer portion 110B and the insulating layer 114 disposed around the second layer portion 110B. The insulating layer 116 is made of an organic insulating material that exhibits fluidity when heated, such as photoresist. Next, heat treatment is performed at a specific temperature to flatten the surface of the insulating layer 116. Through this heat treatment, each of the outer and inner edge portions of the insulating layer 116 is made to have a shape of rounded sloped surface.

Next, the yoke portion layer 112c made of a magnetic material for the write element such as Permalloy is formed on the track width defining layer 112a, the insulating layers 114 and 116, and the coupling portion layer 112b. The yoke portion layer 112c makes up the yoke portion of the top pole layer 112. One of the ends of the yoke portion layer 112c closer to the medium facing surface 120 is located at a distance from the medium facing surface 120. The yoke portion layer 112c is connected to the top shield layer 108 (or the bottom pole layer 182) through the coupling portion layer 112b.

Next, an overcoat layer 117 made of alumina, for example, is formed to cover the entire surface. Next, terminals connected to the MR element 105 and the thin-film coil 110 are formed on the top surface of the overcoat layer 117. Finally, the medium facing surface 120 is formed and the slider 70 including the thin-film magnetic head element 100 is completed. The slider main body 71 is mainly made up of the base 101 and the overcoat layer 117.

The thin-film magnetic head element 100 thus manufactured comprises the read element and the write element. The read element incorporates: the MR element 105 disposed near the medium facing surface 120; and the bottom shield layer 103 and the top shield layer 108 for shielding the MR element 105, wherein portions of the bottom shield layer 103 and the top shield layer 108 close to the medium facing surface 120 are opposed to each other with the MR element 105 disposed in between.

The write element incorporates the bottom pole layer (the top shield layer 108 or the bottom pole layer 182) and the top pole layer 112 that are magnetically coupled to each other and include the pole portions that are opposed to each other and placed in regions on a side of the medium facing surface 120. The write element further incorporates: the write gap layer 109 provided between the pole portion of the bottom pole layer and the pole portion of the top pole layer 112; and the thin-film coil 110 at least part of which is placed between the bottom pole layer and the top pole layer 112 and insulated from the bottom pole layer and the top pole layer 112.

In the thin-film magnetic head element 100, as shown in FIG. 6, throat height TH is the length from the medium facing surface 120 to the end of the insulating layer 111 closer to the medium facing surface 120. The throat height is the length (height) from the medium facing surface 120 to the point at which the distance between the two pole layers starts to increase.

The thin-film magnetic head element 100 writes data on a recording medium by using the write element and reads data written on the recording medium by using the read element.

In the thin-film magnetic head element 100 shown in FIG. 6 and FIG. 7, the MR element 105 may be given as an example of layers patterned through the use of the exposure apparatus and method of the embodiment. Reference is now made to FIG. 8A to FIG. 14A and FIG. 8B to FIG. 14B to describe an example of method of forming the MR element 105. FIG. 8A to FIG. 14A are cross-sectional views of the layered structure parallel to the medium facing surface. FIG. 8B to FIG. 14B each illustrate the top surface of the layered structure. FIG. 8A to FIG. 14A illustrate the respective cross sections taken along line nA-nA of FIG. 8B to FIG. 14B, where n is an integer of 8 to 14.

Figures 8A, 8B:
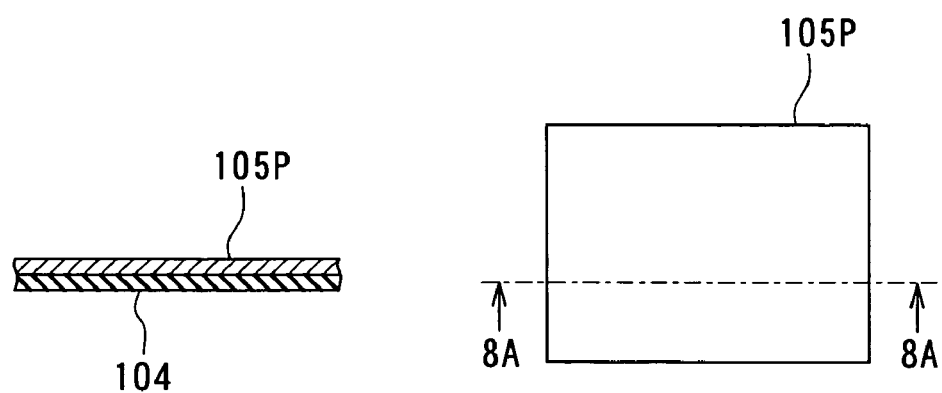
FIG. 8A and FIG. 8B are views for illustrating a step of a method of forming an MR element.

In the method of forming the MR element 105, first, as shown in FIG. 8A and FIG. 8B, an MR film 105P to be the MR element 105 is formed by a method such as sputtering on the bottom shield gap film 104.

FIG. 9A and FIG. 9B illustrate the following step. In the step, first, a photoresist layer is formed on the MR film 105P. Next, the photoresist layer is exposed, using a first mask, wherein the exposure apparatus and method of the embodiment are employed. Next, the photoresist layer is developed and the remaining portion of the photoresist layer is formed into an etching mask 131. The etching mask 131 has two rectangular openings 131a.

Next, as shown in FIG. 10A and FIG. 10B, the MR film 105P is selectively etched by dry etching such as ion milling, using the mask 131.

Figure 11A:
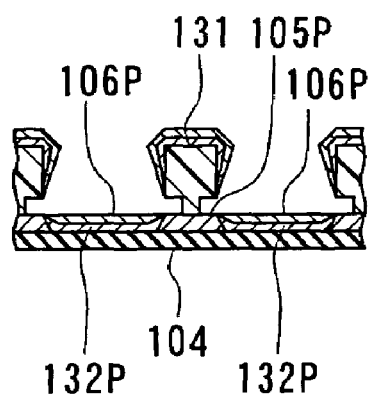
FIG. 11A and FIG. 11B are views for illustrating a step that follows the step shown in FIG. 10A and FIG. 10B.
Figure 11B:
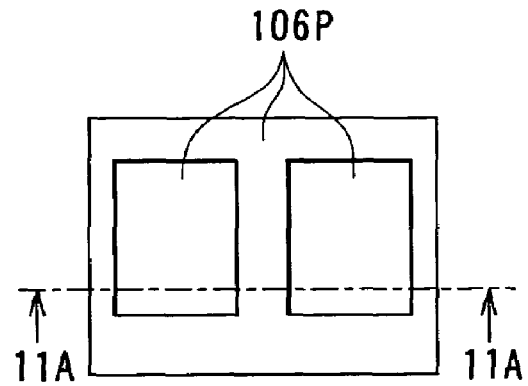

Next, as shown in FIG. 11A and FIG. 11B, a film 132P to be bias field applying layers and a film 106P to be the electrode layers 106 are formed by a method such as sputtering one by one on the entire top surface of the layered structure shown in FIG. 10A and FIG. 10B.

Figure 12A:
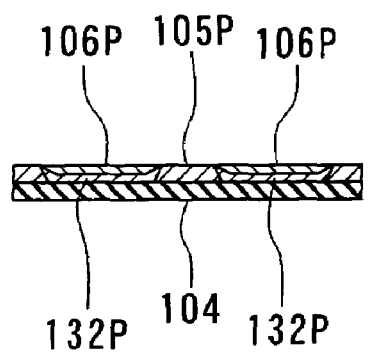
FIG. 12A and FIG. 12B are views for illustrating a step that follows the step shown in FIG. 11A and FIG. 11B.
Figure 12B:
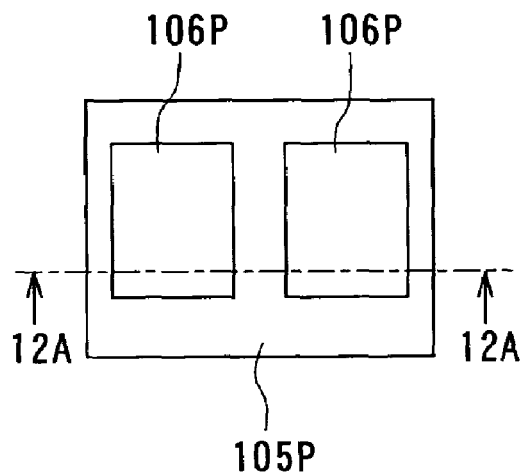

Next, as shown in FIG. 12A and FIG. 12B, the mask 131 is dissolved by using a solvent, for example, to remove the mask 131 and the films formed thereon.

FIG. 13A and FIG. 13B illustrate the following step. In the step, first, a photoresist layer is formed on the layered structure shown in FIG. 12A and FIG. 12B. Next, the photoresist layer is exposed, using a second mask, wherein the exposure apparatus and method of the embodiment are employed. Next, the photoresist layer is developed and the remaining portion of the photoresist layer is formed into an etching mask 133.

FIG. 14A and FIG. 14B illustrate the following step. In the step, first, unwanted portions of the MR film 105P and the films 132P and 106P are selectively etched by dry etching such as ion milling, using the mask 133. Next, the mask 133 is dissolved by using a solvent, for example, to remove the mask 133. As a result, the remaining portion of the MR film 105P is formed into the MR element 105, the remaining portions of the film 132P are formed into the bias field applying layers 132, and the remaining portions of the film 106P are formed into the electrode layers 106. In FIG. 14B, 'MR-h' indicates the MR height. The MR height is the length (height) from an end of the MR element 105 closer to the medium facing surface to the other end.

According to the method of manufacturing the thin-film magnetic head slider described above, as shown in FIG. 4, the medium facing surfaces 120 are formed for a plurality of slider portions 61 aligned in a row in the state of a block. In the step of forming the medium facing surfaces 120, it is required that the MR heights of the head elements 100 aligned in the row all fall within a permissible range. The step of forming the medium facing surfaces 120 includes the step of polishing the medium facing surfaces 120. The MR heights are adjusted by an amount of polishing of the medium facing surfaces 120.

Figure 24:
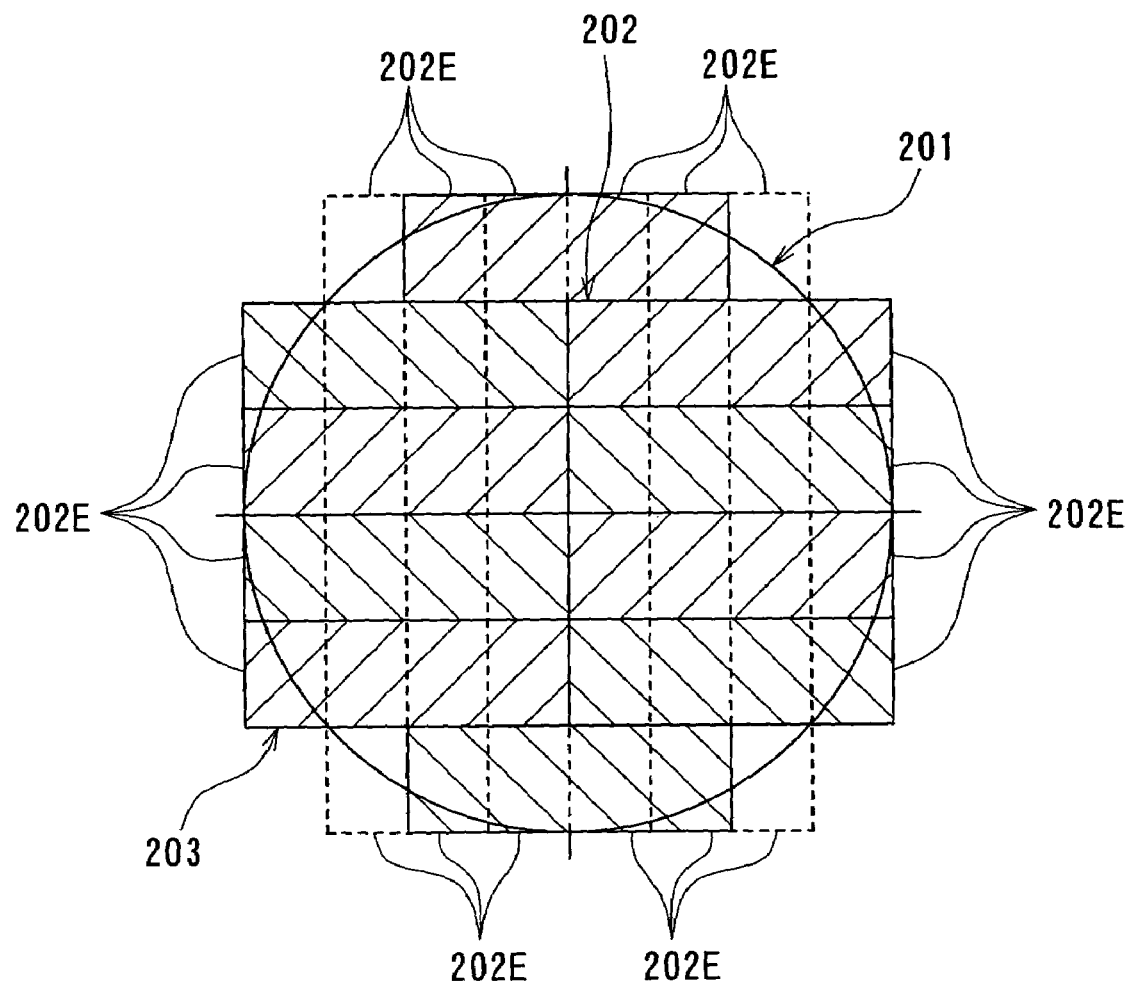
FIG. 24 is a view for illustrating a method of manufacturing thin-film magnetic head sliders.

The operation of the exposure apparatus and the features of the exposure method of the embodiment will now be described in detail. In the embodiment, when the substrate 2 is exposed through the use of the mask 1, a plurality of pattern projection regions 28 are defined in a specific range including the substrate 2 and a region around the substrate 2, wherein at least a portion of each of the pattern projection regions 28 is laid over a portion of the substrate 2. The locations of the pattern projection regions 28 may be the same as the shots 202 of FIG. 24, for example. The mask pattern projected to each of the pattern projection regions 28 includes a pattern corresponding to a plurality of thin-film magnetic head elements 100. Therefore, a plurality of slider portions 61 are formed in a portion of the substrate 2 corresponding to a single pattern projection region 28. In addition, the range to be a single block includes a plurality of pattern projection regions 28. Furthermore, some of the pattern projection regions 28 have portions located outside the edge of the substrate 2. Such pattern projection regions 28 are hereinafter called peripheral projection regions and indicated with numeral 28E.

When each of the pattern projection regions 28 is exposed, according to the embodiment, if the pattern projection region 28 is a peripheral projection region 28E in which two ends thereof opposed to each other in the X direction are different from each other in length of the portion laid over the substrate 2, the exposure region 29 is shifted from one of the two ends that is greater in length of the portion laid over the substrate 2 toward the other end. As a result, a greater number of measurement points are located inside the edge of the substrate 2 in the processing of adjusting the location of the substrate 2 performed before exposure of the peripheral projection regions 28E, compared with the case in which the direction of shift of the exposure region 29 is opposite to the above-mentioned direction. As a result, according to the embodiment, it is possible to precisely detect the location of the surface of the substrate 2 along the direction of optical axis of the optical projection system 3, even in the peripheral projection regions 28E. It is thereby possible to precisely adjust the location of the substrate 2 along the direction of optical axis of the optical projection system 3 so that the image of a portion of the mask pattern is focused on the surface of the substrate 2. As a result, variations in width of layers patterned based on the mask pattern are reduced even though the peripheral projection regions 28E exist.

Figure 15:
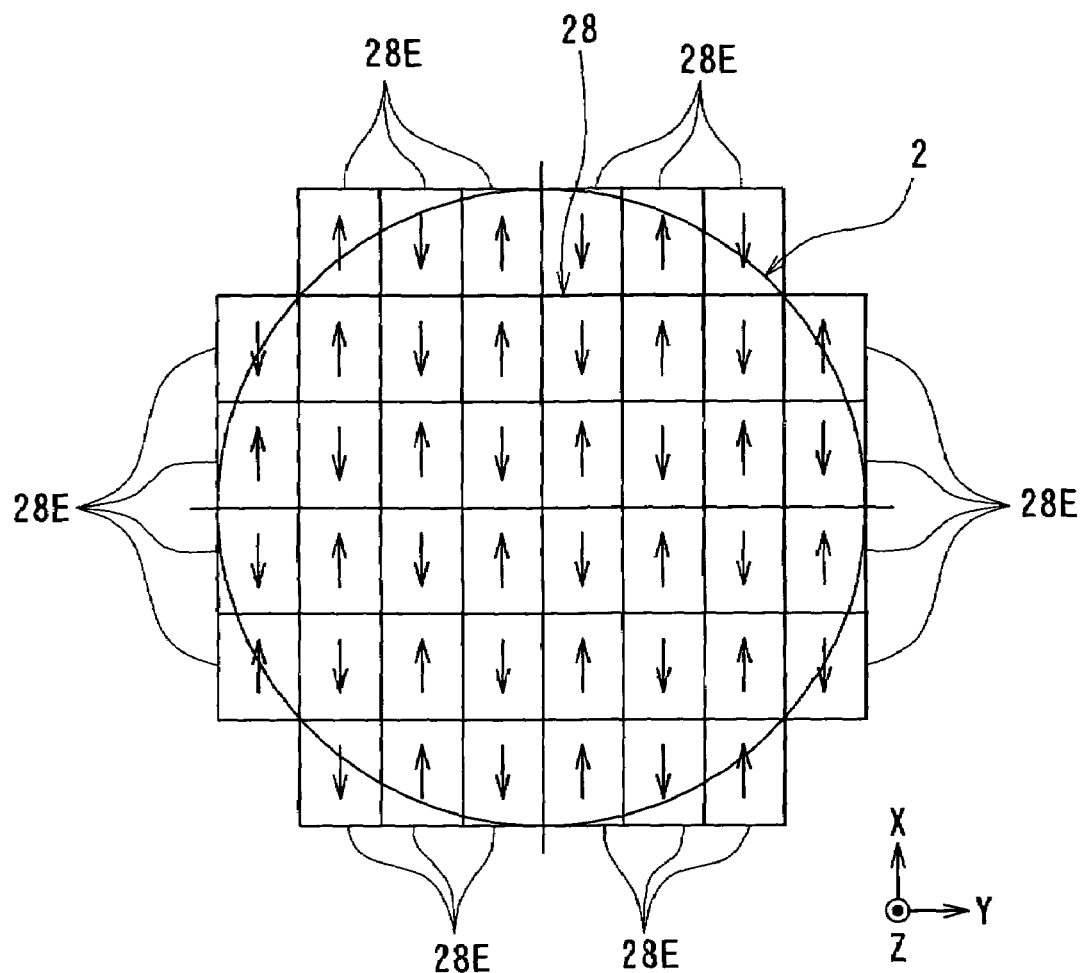
FIG. 15 is a view for illustrating the direction of shift of an exposure region for each of the pattern projection regions in a first reference example.
Figure 16:
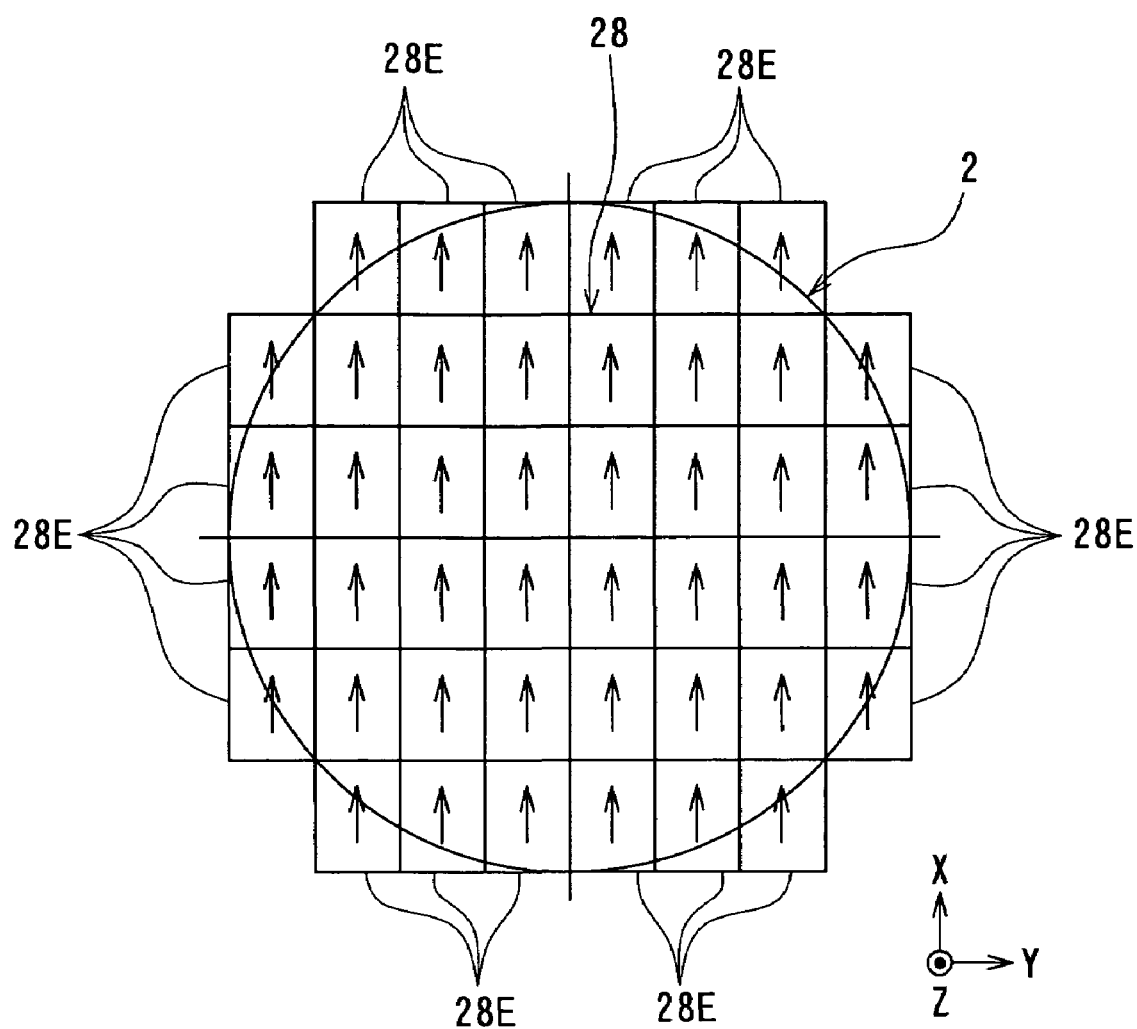
FIG. 16 is a view for illustrating the direction of shift of the exposure region for each of the pattern projection regions in a second reference example.
Figure 17:
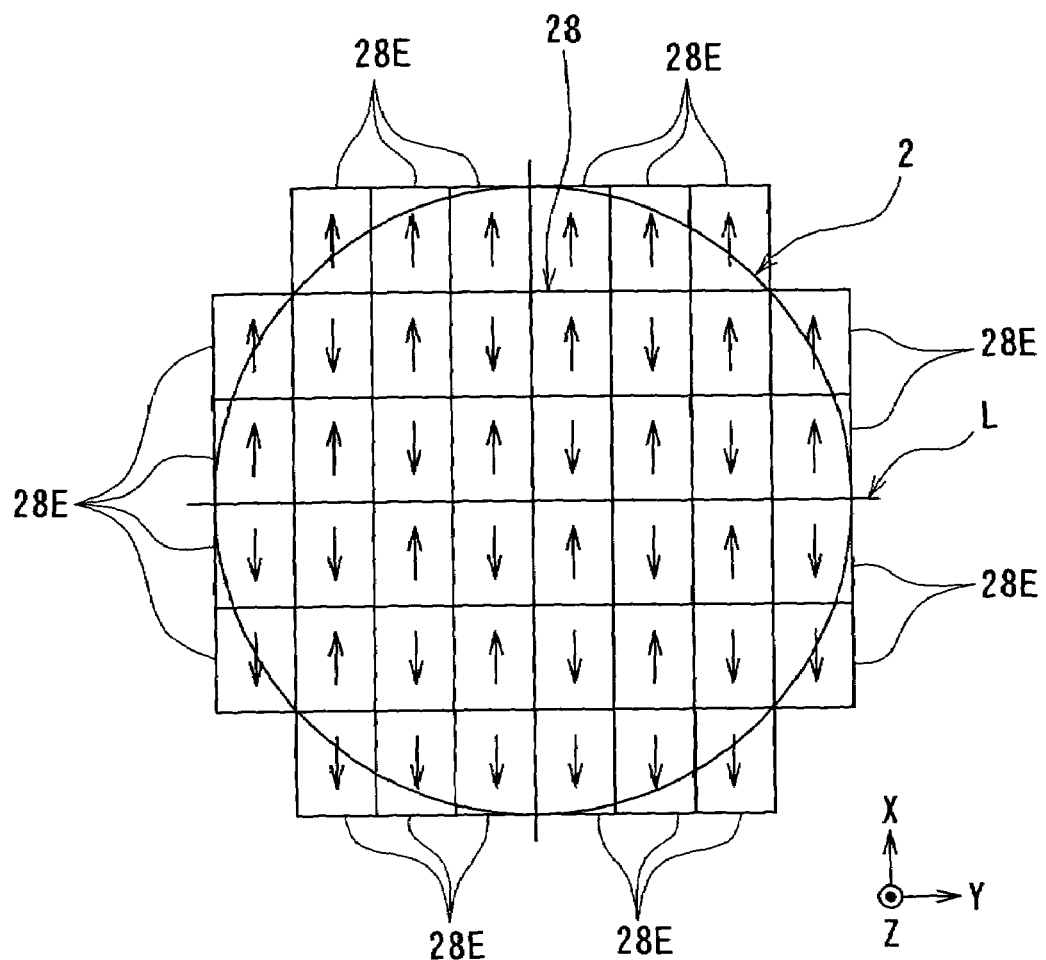
FIG. 17 is a view for illustrating the direction of shift of the exposure region for each of the pattern projection regions in a first example of the embodiment of the invention.
Figure 18:
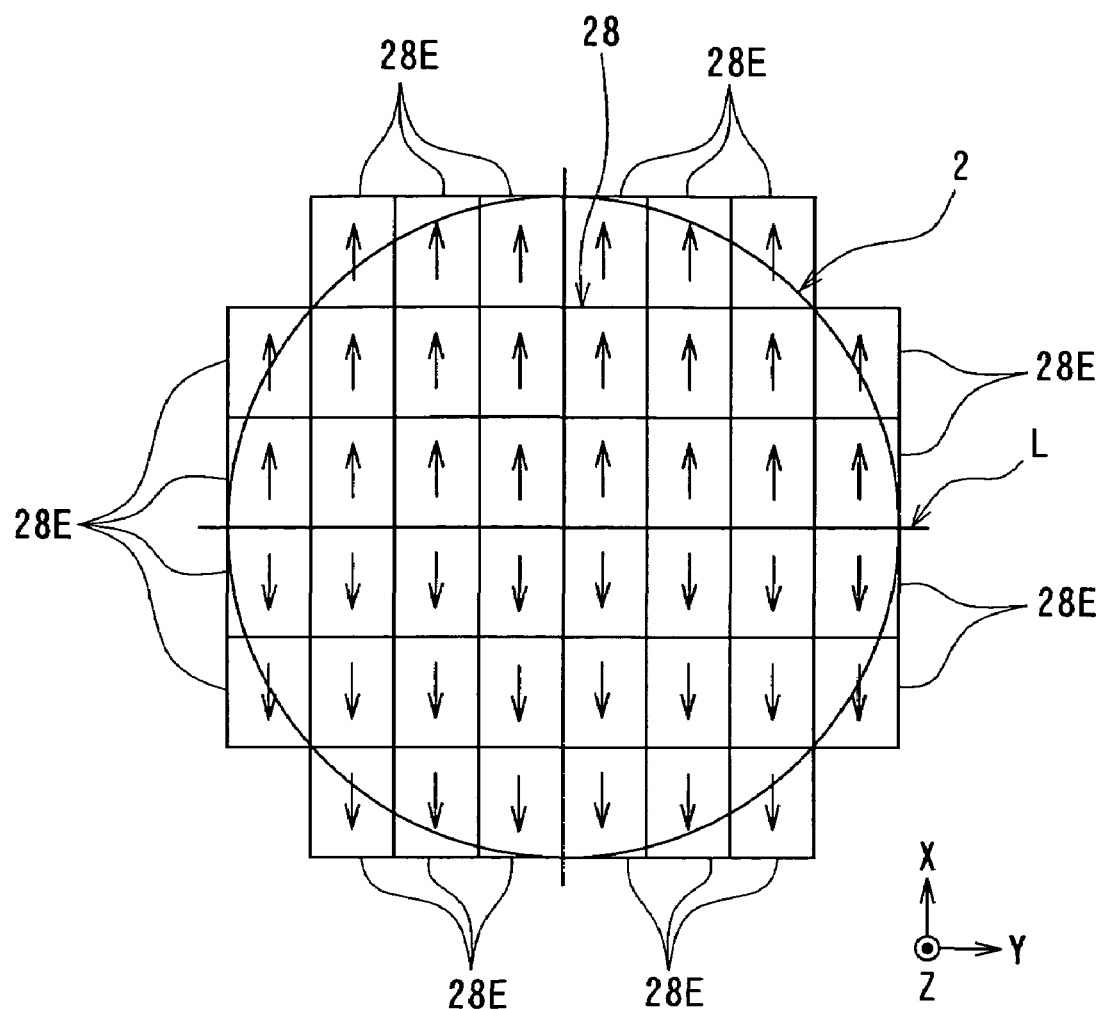
FIG. 18 is a view for illustrating the direction of shift of the exposure region for each of the pattern projection regions in a second example of the embodiment of the invention.

Two reference examples for comparison with the embodiment and two examples of the embodiment will now be described. FIG. 15 indicates the direction of shift of the exposure region 29 for each of the pattern projection regions 28 of the first reference example. FIG. 16 indicates the direction of shift of the exposure region 29 for each of the pattern projection regions 28 of the second reference example. FIG. 17 indicates the direction of shift of the exposure region 29 for each of the pattern projection regions 28 of the first example of the embodiment. FIG. 18 indicates the direction of shift of the exposure region 29 for each of the pattern projection regions 28 of the second example of the embodiment.

In each of the examples shown in FIG. 15 to FIG. 18, forty-four pattern projection regions 28 are defined in a specific range including the circular-plate-shaped substrate 2 and a region around the substrate 2, wherein each of the pattern projection regions 28 has at least a portion laid over a portion of the substrate 2. Twenty of the forty-four pattern projection regions 28 are the peripheral projection regions 28E. For all of the peripheral projection regions 28E of these examples, two ends of each region 28E opposed to each other in the X direction are different from each other in length of the portion laid over the substrate 2. Furthermore, in these examples, a region including four of the pattern projection regions 28 aligned in a row forms a range to be one block. The location of this range to be one block is the same as the region 203 of FIG. 24. In FIG. 15 to FIG. 18, the arrows indicate the directions of shift of the exposure region 29 for the respective pattern projection regions 28.

In the first reference example shown in FIG. 15, for all the pattern projection regions 28, the directions of shift of the exposure region 29 are opposite to each other between respective two of the pattern projection regions 28 that are adjacent to each other along the X or Y direction. In the first reference example, for some of the peripheral projection regions 28E, of the two ends of each of the regions 28E opposed to each other in the X direction, the exposure region 29 is shifted from one end that is smaller in length of the portion laid over the substrate 2 toward the other end. As a result, variations in width of layers patterned based on the mask pattern are increased in the first reference example.

In the second reference example shown in FIG. 16, the directions of shift of the exposure region 29 are identical among all the pattern projection regions 28. In the second reference example, too, for some of the peripheral projection regions 28E, of the two ends of each of the regions 28E opposed to each other in the X direction, the exposure region 29 is shifted from the one end that is smaller in length of the portion laid over the substrate 2 toward the other end. As a result, variations in width of layers patterned based on the mask pattern are increased in the second reference example, too.

In the first example of the embodiment shown in FIG. 17, for all the peripheral projection regions 28E, of the two ends of each of the regions 28E opposed to each other in the X direction, the exposure region 29 is shifted from one end that is greater in length of the portion laid over the substrate 2 toward the other end. In this case, in all the peripheral projection regions 28E, the direction of shift of the exposure region 29 is such a direction as to move away from an imaginary straight line L passing through the center of the surface of the substrate 2 and intersecting the direction of shift of the exposure region 29 at a right angle. In the first example of the embodiment, in all the pattern projection regions 28 except the peripheral projection regions 28E, the directions of shift of the exposure region 29 are opposite to each other between respective two of the pattern projection regions 28 that are adjacent to each other along the X or Y direction. In the first example, it is possible to reduce variations in width of layers patterned based on the mask pattern even though the peripheral projection regions 28E exist. In addition, it is possible to reduce the process time required for exposing the entire substrate 2 since, in all the pattern projection regions 28 except the peripheral projection regions 28E, the directions of shift of the exposure region 29 are opposite to each other between respective two of the pattern projection regions 28 that are adjacent to each other.

In the second example of the embodiment shown in FIG. 18, as in the first example, for all the peripheral projection regions 28E, of the two ends of each of the regions 28E opposed to each other in the X direction, the exposure region 29 is shifted from the one end that is greater in length of the portion laid over the substrate 2 toward the other end. In this case, in all the peripheral projection regions 28E, the direction of shift of the exposure region 29 is such a direction as to move away from the imaginary straight line L. In the second example of the embodiment, in all the pattern projection regions 28 except the peripheral projection regions 28E, too, the directions of shift of the exposure region 29 are such directions as to move away from the imaginary straight line L. Therefore, in all the pattern projection regions 28, the directions of shift of the exposure region 29 are such directions that move away from the imaginary straight line L. In the second example, it is possible to reduce variations in width of layers patterned based on the mask pattern even though the peripheral projection regions 28E exist. In addition, in the second example, the directions of shift of the exposure region 29 are identical among a plurality of pattern projection regions 28 corresponding to a single block that is a single substructure to be processed. As a result, it is possible to reduce displacements along the direction of shift of the exposure region 29 among a plurality of pattern projection regions 28 corresponding to a single block after exposure is performed. It is thereby possible to reduce variations in characteristics of a plurality of thin-film magnetic head sliders 70 manufactured out of a single block.

The result of experiment performed to confirm the effects of the above-described two examples of the embodiment will now be described. In the experiment, the following three indicators were evaluated for the two examples of the embodiment and the two reference examples described above. The first indicator indicates a displacement along the X direction between two of the pattern projection regions 28 that are adjacent to each other in the Y direction. The second indicator indicates variations in width of layers patterned based on the mask pattern. The third indicator indicates variations in resistance of the MR elements 105 after the medium facing surfaces 120 are formed.

In the experiment, a number of MR elements 105 were formed on the substrate 2 through the method illustrated in FIG. 8A to FIG. 14A and FIG. 8B to FIG. 14B for each of the exposure methods of the two reference examples and the two examples of the embodiment. The mask 1 was formed to include overlaying marks disposed near two ends thereof opposed to each other in the Y direction. As a result, for the substrate 2, overlaying marks on the substrate 2 corresponding to the overlaying marks of the mask 1 were formed near two ends of each of the pattern projection regions 28, the ends being opposed to each other in the Y direction.

Figure 19:
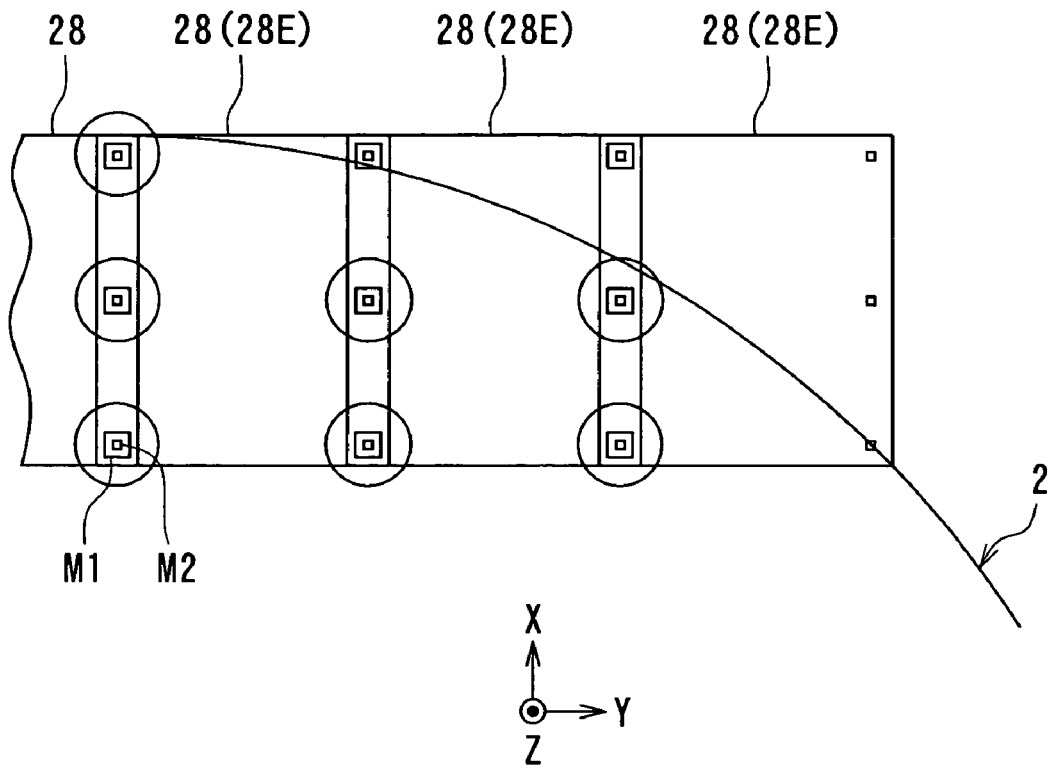
FIG. 19 is a view for illustrating a substrate, pattern projection regions, and overlaying marks that are used in an experiment performed for confirming the effects of the first and second examples of the embodiment of the invention.

FIG. 19 illustrates the substrate 2, the pattern projection regions 28 and the overlaying marks. In FIG. 19, the exposure processing is performed one by one from the left one of the pattern projection regions 28 aligned in the Y direction. After exposure and development of the substrate 2, out of the layer patterned in accordance with the overlaying marks of the mask 1, two types of overlaying marks M1 and M2 are formed near the two ends of each of the pattern projection regions 28, the ends being opposed to each other in the Y direction. Three overlaying marks M1 are disposed near the left end of each of the pattern projection regions 28 of FIG. 19. Three overlaying marks M2 are disposed near the right end of each of the pattern projection regions 28 of FIG. 19. Each of the overlaying marks M1 and M2 is rectangular but the marks M1 are greater than the marks M2. Of the respective two of the pattern projection regions 28 adjacent to each other in the Y direction, the mark M1 of the right-hand one of the regions 28 of FIG. 19 is located to be laid over the mark M2 of the left-hand one of the regions 28 of FIG. 19.

In FIG. 19, the marks M1 and M2 are shown in the portions of the pattern projection regions 28 located outside the edge of the substrate 2, too, for convenience. However, the marks M1 and M2 are actually formed only in the portions of the pattern projection regions 28 located inside the edge of the substrate 2. In FIG. 19, the marks M1 and M2 actually formed are circled. The marks M1 and M2 are observed with the observing microscope 27.

Figure 20:
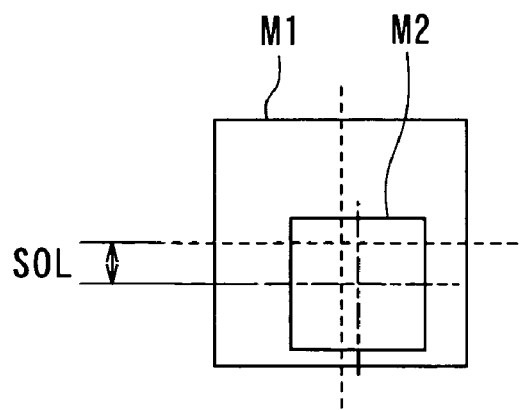
FIG. 20 is a view for illustrating the overlaying marks of FIG. 19 that are enlarged.

FIG. 20 illustrates the overlaying marks M1 and M2 of FIG. 19 that are enlarged. The control device 50 of the exposure apparatus determines the locations of a plurality of pattern projection regions 28 such that the locations of the centers of the marks M1 and M2 coincide with each other. However, since the mechanical precision of the exposure apparatus is not perfect, there are some cases in which the locations of the pattern projection regions 28 after exposure is actually performed are off the ideal locations of the pattern projection regions 28 described above. As a result, there are some cases in which the locations of the centers of the marks M1 and M2 are displaced as shown in FIG. 20. Here, 'SOL' indicates an amount of displacement of each of the locations of the centers of the marks M1 and M2 along the X direction. The first indicator is three times the standard deviation of the amounts of displacements SOL of all the marks M1 and M2 on a single substrate 2, and is indicated with SOL-$3\sigma$. The greater the value of the first indicator SOL-$3\sigma$, the greater is the displacement along the X direction between the respective two of the pattern projection regions 28 adjacent to each other in the Y direction.

Figure 21:
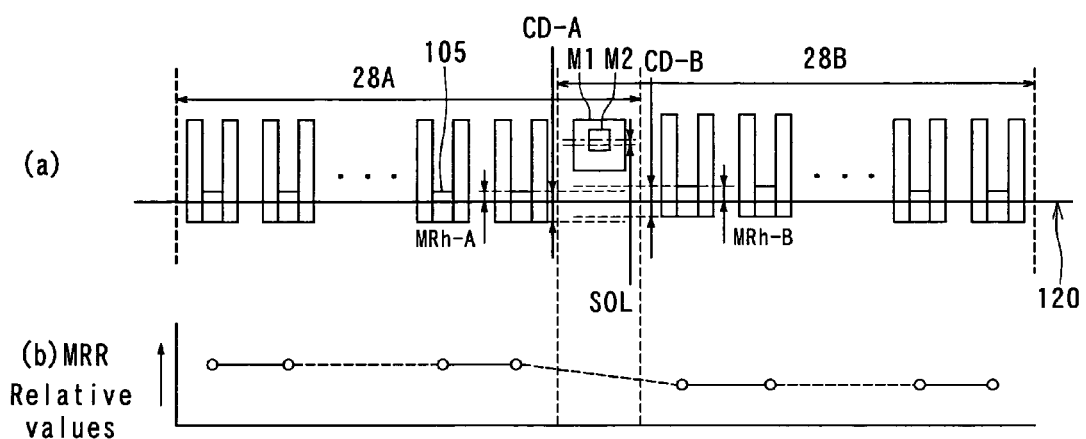
FIG. 21 is a view for illustrating second and third indicators that were evaluated in the experiment.

Reference is now made to FIG. 21 to describe the second and third indicators. FIG. 21(a) schematically illustrates the MR elements 105 aligned in a row along the Y direction, out of a plurality of MR elements 105 included in two of the pattern projection regions 28 adjacent to each other in the Y direction. FIG. 21(b) indicates the resistances (relative values) MRR obtained after the medium facing surfaces 120 are formed for the MR elements 105 shown in FIG. 21(a). The left-hand one of the two pattern projection regions 28 of FIG. 21(a) will be called a pattern projection region 28A while the right-hand one will be called a pattern projection region 29B.

Here, 'CD' indicates the length of each of the MR elements 105 before the medium facing surface 120 is formed, the length being orthogonal to the medium facing surface 120. 'MRh' indicates the MR height, that is, the length of each of the MR elements 105 after the medium facing surface 120 is formed, the length being orthogonal to the medium facing surface 120. In FIG. 21(a), the lengths CD and MRh of the MR elements 105 included in the region 28A are indicated with CD-A and MRh-A, respectively, and the lengths CD and MRh of the MR elements 105 included in the region 28B are indicated with CD-B and MRh-B, respectively. The lengths CD vary in accordance with variations in width of layers patterned based on the mask pattern. Here, the second indicator is the range of variations in the lengths CD of all the MR elements 105 included in a single substrate 2, and is indicated with CD-Range. The greater the CD-Range, the greater are variations in width of the layers patterned based on the mask pattern.

Ideally, the resistances MRR of all the MR elements 105 included in a single substrate 2 are equal. However, variations in resistances MRR may actually result. Here, the third indicator is three times the standard deviation of the resistances MRR of all the MR elements 105 included in a single substrate 2, and is indicated with MRR-3σ. The greater the value of the third indicator MRR-3σ, the greater are variations in resistance of the MR elements 105 after the medium facing surfaces 120 are formed. To reduce the third indicator MRR-3σ, it is required to reduce both the first indicator SOL-3σ and the second indicator CD-Range.

The table below shows the values of the three indicators obtained through the experiment for the two reference examples and the two examples of the embodiment. In the experiment, the target value of the length CD was 200 nm. Each of the SOL-3σ and CD-Range is expressed in nanometers (nm). The MRR-3σ is expressed in ohms.

TABLE 1

| Indicators | $1^{st}$ reference | $2^{nd}$ reference | $1^{st}$ example | $2^{nd}$ example |
|---|---|---|---|---|
| SOL-3σ | 20.3 | 16.5 | 19.6 | 12.0 |
| CD-Range | 10.5 | 9.2 | 4.8 | 4.3 |
| MRR-3σ | 2.8 | 2.4 | 2.3 | 1.5 |

As shown in the table, the values of the second indicator CD-Range of the first and second examples of the embodiment are smaller than those of the first and second reference examples. This indicates that each of the first and second examples of the embodiment makes it possible to reduce variations in width of the layers patterned based on the mask pattern.

As shown in the table, the value of the first indicator SOL-3σ of the second example of the embodiment is smaller than that of each of the first and second reference examples and the first example of the embodiment. This indicates that the second example of the embodiment makes it possible to reduce a displacement along the direction of shift of the exposure region 29 (the X direction) between two of the pattern projection regions 28 that are adjacent to each other in the Y direction after exposure is performed.

As shown in the table, the values of the third indicator MRR-3σ of the first and second examples of the embodiment are smaller than those of the first and second reference examples. In particular, the value of the third indicator MRR-3σ of the second example of the embodiment is much smaller than that of each of the first and second reference examples. This indicates that each of the first and second examples of the embodiment makes it possible to reduce variations in characteristics (the resistances of the MR elements 105) among a plurality of thin-film magnetic head sliders 70 manufactured out of a single block. In particular, this effect is noticeable in the second example.

The present invention is not limited to the foregoing embodiment but may be practiced in still other ways. For example, the invention is not only applicable to the case of manufacturing thin-film magnetic head sliders as microdevices, but is widely applicable to cases in which a plurality of microdevices are formed in a portion of a substrate corresponding to a single pattern projection region. Microdevices that can be manufactured through the use of the invention other than thin-film magnetic head sliders include semiconductor lasers and light-emitting diodes, for example.

In the foregoing embodiment, the thin-film magnetic head element is disclosed, having a structure in which the read element is formed on the base and the write element is stacked on the read element. Alternatively, the read element may be stacked on the write element.

Obviously many modifications and variations of the present invention are possible in the light of the above teachings. It is therefore to be understood that within the scope of the appended claims the invention may be practiced otherwise than as specifically described.

What is claimed is:

1. An exposure method for exposing a substrate based on a pattern by sequentially projecting the pattern formed in a mask onto a plurality of pattern projection regions each of which has at least a portion laid over a portion of the substrate, the method comprising the steps of:

exposing each of the pattern projection regions based on the pattern in such a manner that, for each of the pattern projection regions, the mask and the substrate are moved in synchronization with each other while projecting a portion of the pattern through an optical projection system onto a portion of the pattern projection region, and that an exposure region onto which the portion of the pattern is projected to perform exposure is thereby shifted from one of first and second ends of the pattern projection region toward the other end; and adjusting a location of the substrate along a direction of optical axis of the optical projection system before the step of exposing each of the pattern projection regions, in such a manner that, in each of the pattern projection regions, a location of a surface of the substrate along the direction of optical axis of the optical projection system is detected, and the location of the substrate is adjusted based on a result of the detection so that an image of the portion of the pattern is focused on the surface of the substrate, wherein, in the step of exposing each of the pattern projection regions, in some of the pattern projection regions in each of which a portion thereof is located outside an edge of the substrate and in each of which the first and second ends have different lengths of portions laid over the substrate, the exposure region is shifted from one of the first and second ends that is greater in length of the portion laid over the substrate toward the other end.

2. The method according to claim 1, wherein, in the step of exposing each of the pattern projection regions, in some of the pattern projection regions that are entirely located inside the edge of the substrate, the exposure region is shifted such that directions of shift of the exposure region are opposite to each other between respective two of the pattern projection regions that are adjacent to each other in a direction orthogonal to the directions of shift of the exposure region.

3. The method according to claim 1, wherein:

an overall shape of the edge of the substrate is substantially circle; and in the step of exposing each of the pattern projection regions, in all the pattern projection regions, the exposure region is shifted in a direction that moves away from an imaginary straight line passing through a center of the surface of the substrate and intersecting the direction of shift of the exposure region at a right angle.

4. The method according to claim 1, wherein the pattern is one intended for use for manufacturing a plurality of microdevices out of a portion of the substrate corresponding to a single pattern projection region.

5. The method according to claim 4, wherein the microdevices are thin-film magnetic head sliders.

6. The method according to claim 1, wherein, in the step of adjusting the location of the substrate, the location of the surface of the substrate is detected in a region of each of the pattern projection regions that first becomes the exposure region.

7. The method according to claim 1, wherein:

the pattern is one intended for use for manufacturing a plurality of thin-film magnetic head sliders out of a portion of the substrate corresponding to a single pattern projection region;

the substrate is one intended to be divided into a plurality of substructures to be processed in a manufacturing process of the thin-film magnetic head sliders, each of the substructures being made up of a portion of the substrate over which a plurality of pattern projection regions are laid, so that processing is performed for each of the substructures; and in the step of exposing each of the pattern projection regions, the exposure region is shifted in identical directions among a plurality of pattern projection regions corresponding to a single sub structure.

* * * * *